United States Patent
Fujii et al.

(10) Patent No.: US 9,825,054 B2
(45) Date of Patent: Nov. 21, 2017

(54) SEMICONDUCTOR MEMORY DEVICE AND METHOD OF MANUFACTURING THE SAME

(71) Applicant: Toshiba Memory Corporation, Minato-ku (JP)

(72) Inventors: Kotaro Fujii, Yokkaichi (JP); Hideaki Aochi, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 9 days.

(21) Appl. No.: 15/271,473

(22) Filed: Sep. 21, 2016

(65) Prior Publication Data

US 2017/0271365 A1    Sep. 21, 2017

Related U.S. Application Data

(60) Provisional application No. 62/309,167, filed on Mar. 16, 2016.

(51) Int. Cl.
| | | |
|---|---|---|
| H01L 27/115 | (2017.01) | |
| H01L 29/792 | (2006.01) | |
| H01L 21/8238 | (2006.01) | |
| H01L 27/11582 | (2017.01) | |
| H01L 27/11565 | (2017.01) | |
| H01L 23/528 | (2006.01) | |

(52) U.S. Cl.
CPC .... *H01L 27/11582* (2013.01); *H01L 23/5283* (2013.01); *H01L 27/11565* (2013.01)

(58) Field of Classification Search
CPC ......... H01L 27/11582; H01L 27/11565; H01L 23/5283

USPC ........ 257/324, 314, 319, 321, 329, E27.026, 257/E27.103, E29.309, E21.21, E21.267, 257/E21.293, E21.423; 365/185.11; 438/257, 268, 287

See application file for complete search history.

(56) References Cited

U.S. PATENT DOCUMENTS 7,927,953 B2 *   4/2011   Ozawa .............. H01L 21/28282
                                                                257/E21.21
9,171,948 B2 *   10/2015  Mori ....................... H01L 29/78
(Continued)

FOREIGN PATENT DOCUMENTS

| JP | 2010-140997 | 6/2010 |
|---|---|---|
| JP | 2011-199194 | 10/2011 |
| JP | 2014-175348 | 9/2014 |

*Primary Examiner* — Dao H Nguyen
(74) *Attorney, Agent, or Firm* — Oblon, McClelland, Maier & Neustadt, L.L.P.

(57) ABSTRACT

The memory string comprises: a first semiconductor layer; a stacked body in which a plurality of conductive layers and a plurality of interlayer insulating layers are stacked along a first direction above the first semiconductor layer; and a second semiconductor layer having a longitudinal direction along the first direction and provided above the first semiconductor layer. The memory insulating layer includes a charge accumulation layer between the second semiconductor layer and the plurality of the conductive layers. The core insulating layer has a longitudinal direction along the first direction, and is provided in the second semiconductor layer. The oxide film layer is provided between the core insulating layer and the second semiconductor layer.

17 Claims, 23 Drawing Sheets

(56) References Cited

U.S. PATENT DOCUMENTS

2011/0227140 A1* 9/2011 Ishiduki ............ H01L 27/11578
                                                  257/324
2013/0234231 A1* 9/2013 Fujiki ............... H01L 29/66833
                                                  257/324
2014/0252443 A1   9/2014 Kawai et al.

* cited by examiner

SEMICONDUCTOR MEMORY DEVICE AND METHOD OF MANUFACTURING THE SAME

This application is based on and claims the benefit of priority from prior U.S. prior provisional Patent Application No. 62/309,167, filed on Mar. 16, 2016, the entire contents of which are incorporated herein by reference.

BACKGROUND

Field

Embodiments described herein relate to a semiconductor memory device and a method of manufacturing the same.

Description of the Related Art

A flash memory that stores data by accumulating a charge in a charge accumulation layer, is known. Such a flash memory is connected by a variety of systems such as NAND type or NOR type, and configures a semiconductor memory device. In recent years, increasing of capacity and raising of integration level of such a nonvolatile semiconductor memory device have been proceeding. Moreover, a semiconductor memory device in which memory cells are disposed three-dimensionally (three-dimensional type semiconductor memory device) has been proposed to raise the integration level of the memory.

DETAILED DESCRIPTION

A semiconductor memory device according to an embodiment described below comprises: a first semiconductor layer; a stacked body in which a plurality of conductive layers and a plurality of interlayer insulating layers are alternately stacked along a first direction above the first semiconductor layer; and a second semiconductor layer having a longitudinal direction along the first direction, and provided above the first semiconductor layer. A memory insulating layer includes a charge accumulation layer provided between the second semiconductor layer and the plurality of the conductive layers. A core insulating layer has a longitudinal direction along the first direction, and is provided in the second semiconductor layer. An oxide film layer is provided between the core insulating layer and the second semiconductor layer.

Next, a nonvolatile semiconductor memory device according to an embodiment will be described in detail with reference to the drawings. Note that this embodiment is merely an example, and is not shown with the intention of limiting the present invention. Moreover, each of the drawings of the nonvolatile semiconductor memory device employed in the embodiment below is schematic, and thicknesses, widths, ratios, and so on, of layers are different from those of the actual nonvolatile semiconductor memory device.

The embodiment below relates to a nonvolatile semiconductor memory device having a structure in which a plurality of MONOS (Metal-Oxide-Nitride-Oxide-Semiconductor) type memory cells (transistors) are provided stacked in a certain direction, each of the MONOS type memory cells including: a semiconductor layer acting as a channel provided in a column shape having the certain direction as its longitudinal direction; and a gate electrode layer provided on a side surface of the semiconductor layer via a charge accumulation layer. However, this is also not intended to limit the present invention, and the present invention may be applied also to a memory cell of another form of charge accumulation layer, for example, a SONOS (Semiconductor-Oxide-Nitride-Oxide-Semiconductor) type memory cell, or a floating gate type memory cell, and so on.

[First Embodiment]

Figure 1:
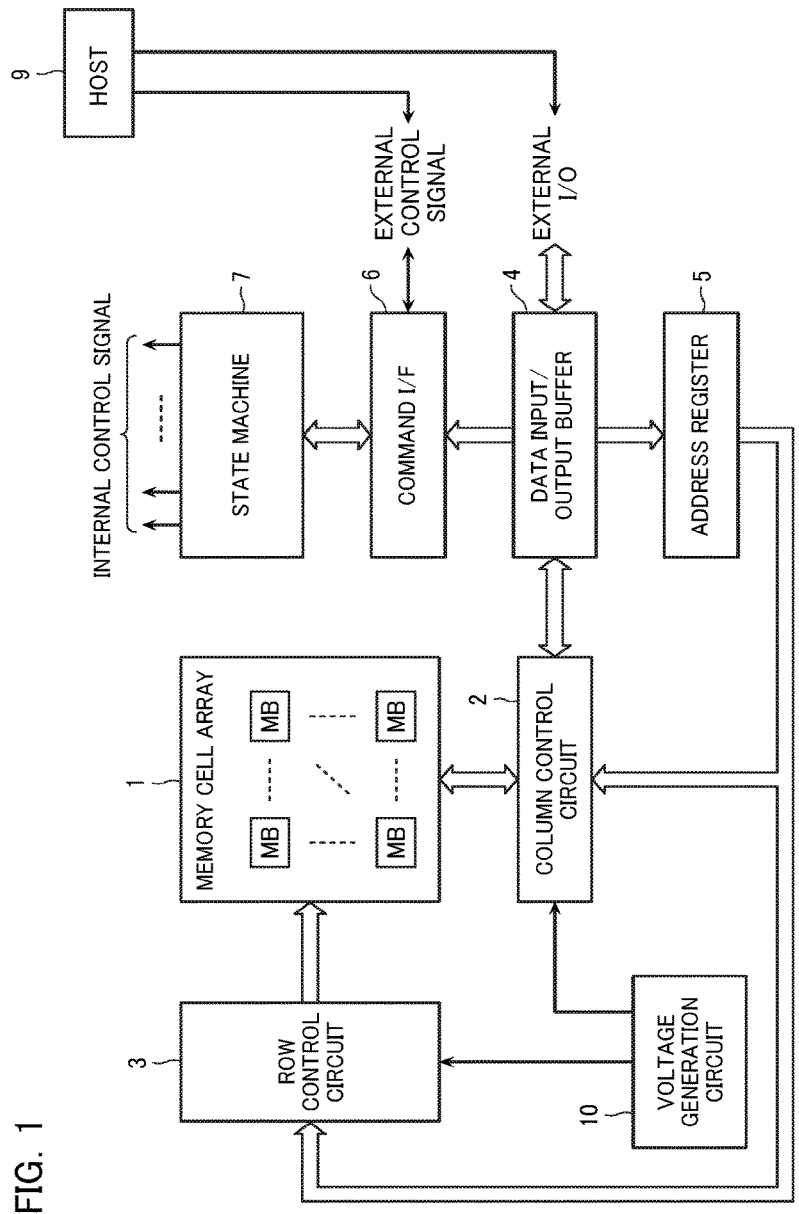
FIG. 1 is a block diagram of the nonvolatile semiconductor memory device according to the first embodiment.

FIG. 1 is a block diagram of the nonvolatile semiconductor memory device according to the first embodiment. This nonvolatile semiconductor memory device stores user data inputted from an external host 9, in a certain address in the memory cell array 1. In addition, this nonvolatile semiconductor memory device reads the user data from a certain address in the memory cell array 1, and outputs it to the external host 9.

This nonvolatile semiconductor memory device includes a memory cell array 1 that stores user data. The memory cell array 1 includes a plurality of memory blocks MB therein. These memory blocks MB includes, as will be explained later with reference to FIG. 2, plural memory cells MC, in addition to bit lines BL and word lines WL that are connected to these memory cells MC.

This nonvolatile semiconductor memory device comprises a column control circuit 2 provided in the periphery of the memory cell array 1. When the user data is written, the column control circuit 2 transfers a voltage generated in a voltage generation circuit 10 to a desired bit line BL, depending on the inputted user data. In addition, the column control circuit 2 includes a sense amplifier not illustrated. When the reading of the user data is performed, the sense amplifier detects a voltage or potential of a certain bit line BL.

This nonvolatile semiconductor includes a row control circuit 3 provided in the periphery of the memory cell array 1. The row control circuit 3 transfers a voltage generated in the voltage generation circuit 10 to a desired word line WL or the like, depending on the inputted address data.

This nonvolatile semiconductor memory device includes an address register 5 that supplies address data to the column control circuit 2 and the row control circuit 3. The address register 5 holds address data inputted from a data input/output buffer 4.

This nonvolatile semiconductor includes a voltage generation circuit 10 that supplies a voltage to the memory cell array 1 through the column control circuit 2 and the row control circuit 3. The voltage generation circuit 10 generates and outputs a voltage of a certain magnitude, at a certain timing, depending on an internal control signal that is inputted from a state machine 7.

The nonvolatile semiconductor memory device includes the state machine 7 which inputs an internal control signal to the voltage generation circuit 10 or the like. The state machine 7 receives command data from the host 9 via a command interface 6, and performs reading, writing, erasing, management of data input/output, and the like.

This nonvolatile semiconductor memory device includes a data input/output buffer 4 connected to the external host 9 via an I/O line. The data input/output buffer 4 receives writing data from the external host 9, and transfers it to the column control circuit 2. The data input/output buffer 4 receives command data from the external host 9, and transfers it to the command interface 6. In addition, the data input/output buffer 4 receives address data from the external host 9, and transfers it to the address register 5. Furthermore, the data input/output buffer 4 receives reading data from the column control circuit 2, and transfers it to the external host 9.

This nonvolatile semiconductor memory device includes the command interface 6 that receives an external control signal from the external host 9. The command interface 6 determines, depending on the external control signal input from the external host 9, whether data provided to the data input/output buffer 4 is user data, command data or address data, and controls the data input/output buffer 4. Also, the command interface 6 transfers command data received from the data input/output buffer 4 to the state machine 7. Note that the column control circuit 2, the row control circuit 3, the state machine 7, the voltage generation circuit 10 and the like configures a control circuit that controls the memory cell array 1.

Figure 2:
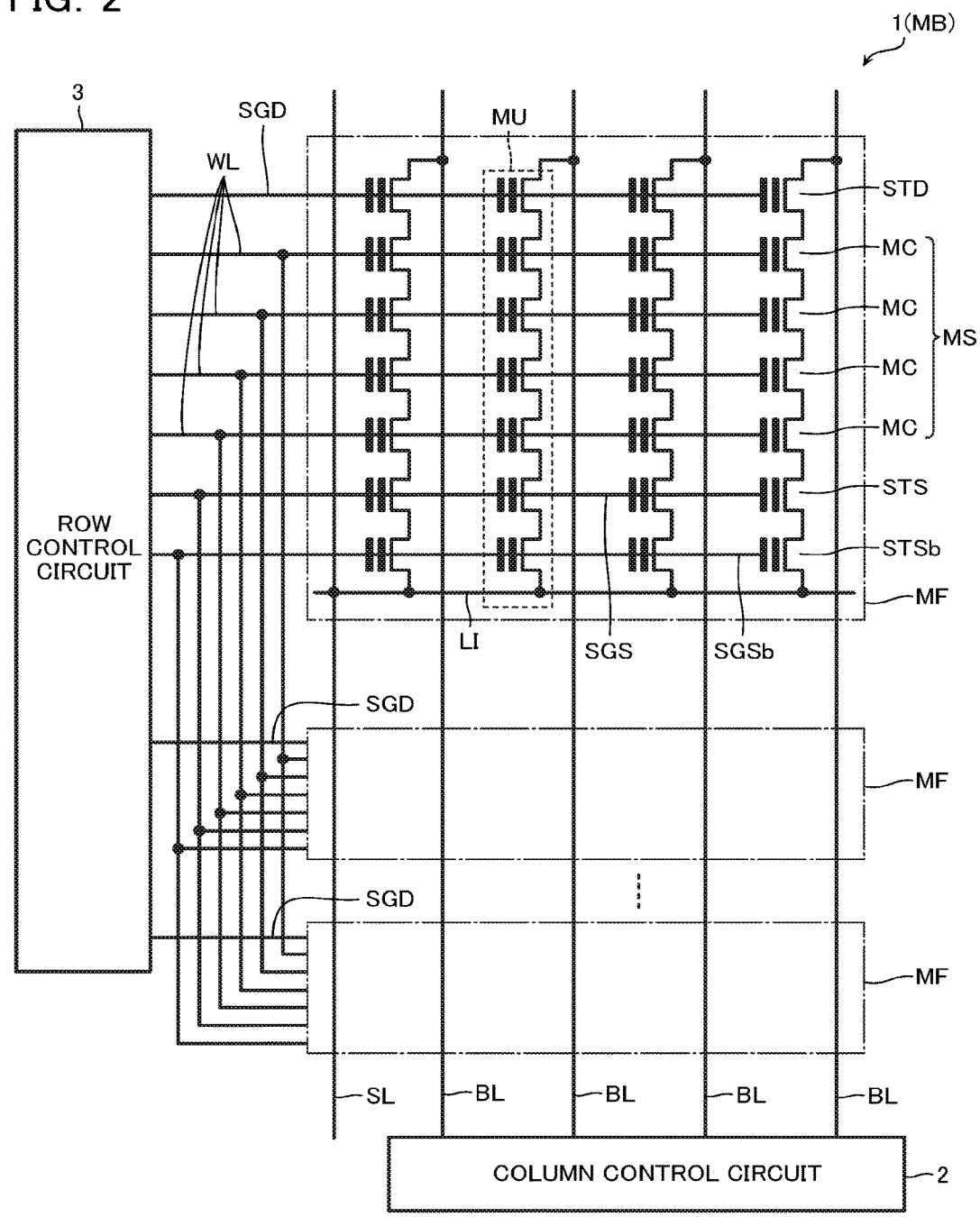
FIG. 2 is a circuit diagram showing a structure of part of the nonvolatile semiconductor memory device according to the first embodiment.

Next, with reference to FIG. 2, the circuit configuration of part of the memory cell array 1 according to the present embodiment will be described. FIG. 2 is an equivalent circuit diagram showing the structure of the memory blocks MB that configures the memory cell array 1.

The memory blocks MB comprises a plurality of memory cells MC. The memory cell MCs store data of 1 bit or plural bits that configures the above-mentioned user data, respectively. Furthermore, a certain drain side select gate line SGD and a certain word line WL in the memory blocks MB are selected by the row control circuit 3, thereby a certain number of the memory cells MC are selected. These selected memory cells MC are connected to the bit lines BL, respectively. The currents or the voltages of these bit lines BL are different in magnitude, depending on data stored in the memory cells MC. The column control circuit 2 detects a current or a voltage of the bit lines BL to judge stored data in the plural memory cells MC and output it as user data.

The memory blocks MB include a plurality of memory fingers MF, respectively. The plurality of the bit lines BL and the source line SL are commonly connected to the plurality of the memory fingers MF. Each of the memory fingers MF is connected to the column control circuit 2 via the bit lines BL, and is connected to the source line driver which is not illustrated via the source line SL.

The memory finger MF includes a plurality of memory units MU. The memory unit MU has one end connected to the bit line BL, and the other end connected to the source line SL via the source contact LI. The memory units MU included in one memory finger MF are connected to different bit lines BL, respectively. The memory unit MU includes plurality of memory cells MC connected in series. As will be described later, the memory cell MC includes a semiconductor layer that functions as a channel, a charge accumulation layer and a control gate electrode. The memory cell MC accumulates electric charges in the charge accumulation layer depending on the voltage applied to the control gate electrode, and changes its control gate voltage (a threshold voltage) for causing the channel to be in a conductive state. Hereinafter, a plurality of memory cells MC connected in series is referred to as "a memory string MS". The row control circuit 3 transfers a voltage to a certain word line WL to transfer the voltage to the control gate electrode of a certain memory cell MC in a memory string MS.

A word line WL is commonly connected to control gates of a plurality of the memory cells MC included indifferent memory strings MS. The plurality of memory cells MC are connected to the row control circuit 3 through the word lines WL.

Also, in the example shown in FIG. 2, the word lines WL are respectively provided for each of the memory cells MC included in the memory unit MU. A word line WL is provided in common for all of the memory units MU included in the memory blocks MB.

The memory unit MU includes a drain side select gate transistor STD connected between the memory string MS and the bit line BL. A drain side select gate line SGD is connected to a control gate of the drain side select gate transistor STD. The drain side selection gate line SGD is connected to the row control circuit 3 to selectively connect the memory strings MS and the bit lines BL, depending on an input signal.

In addition, in the example shown in FIG. 2, each of the memory fingers MF is provided with a drain side select gate line SGD independently. The drain side select gate line SGD is commonly connected to control gates of all of the drain side select gate transistors STD in the memory finger MF. The row control circuit 3 selects a certain drain side select gate line SGD to selectively connect all of the memory strings MS in a certain memory finger MF to the bit lines BL.

The memory unit MU includes a source side select gate transistor STS and a lowermost source side select gate transistor STSb that are connected between the memory string MS and the source contact LI. The lowermost source side select gate transistor STSb is connected to the lower end of the memory unit MU, and the source side select gate transistor STS is connected between the lowermost source side select gate transistor STSb and the memory cell MC.

A source side select gate line SGS is connected to a control gate of the source side select gate transistor STS. A lowermost source side select gate line SGSb is connected to a control gate of the lowermost source side select gate transistor STSb. In addition, in an example shown in FIG. 2, the source side select gate line SGS is commonly connected to all of the source side select gate transistors STS in the memory block MB.

Similarly, the lowermost source side select gate line SGSb is commonly connected to all of the lowermost source side select gate transistors STSb in the memory block MB. The row control circuit 3 connects all of the memory strings MS in the memory block MB to the source line SL, depending on an input signal.

Figure 3:
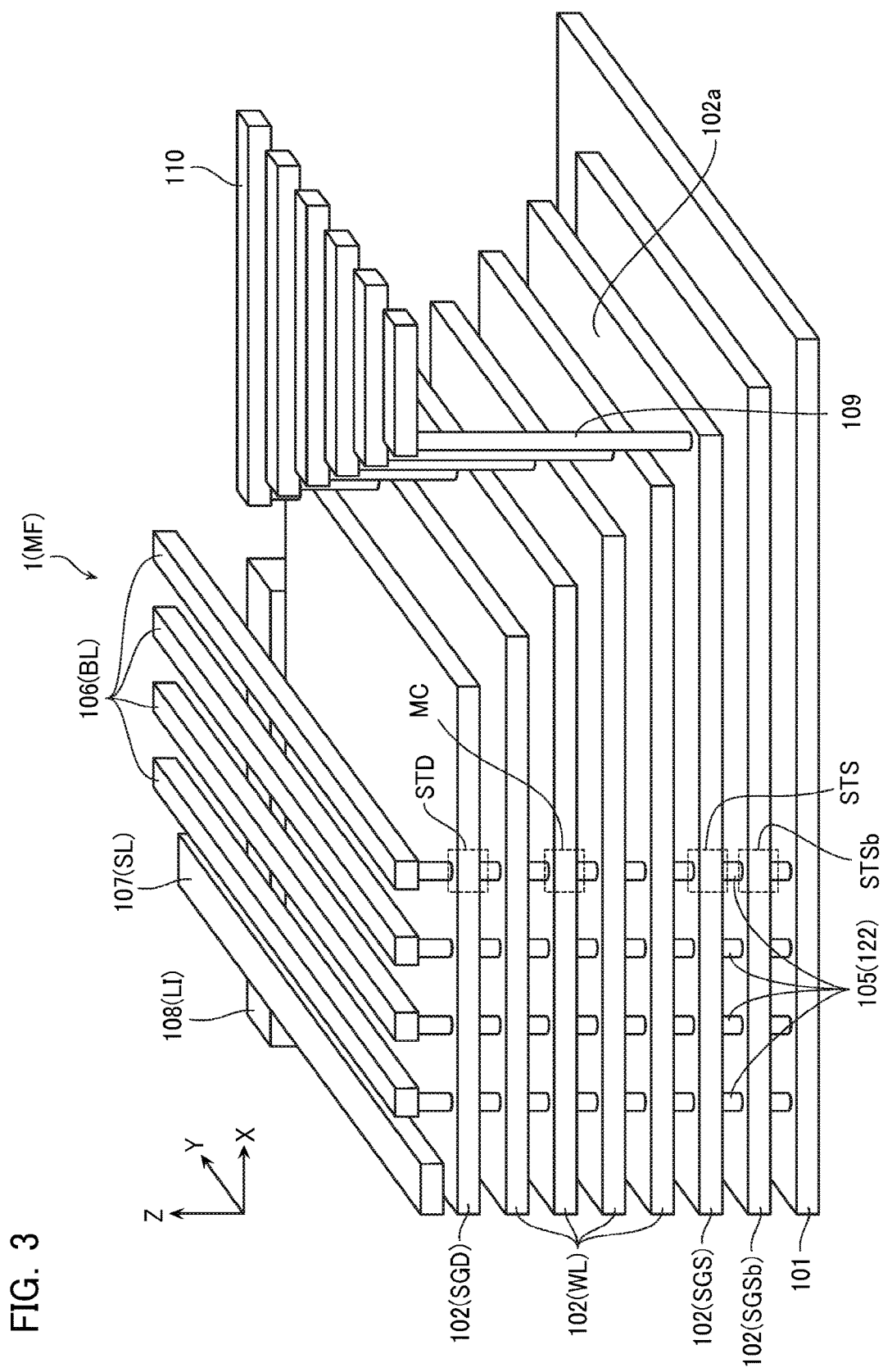
FIG. 3 is a perspective diagram showing a structure of apart of the nonvolatile semiconductor memory device according to the first embodiment.

Next, with reference to FIG. 3, the schematic structure of the memory cell array 1 will be described. FIG. 3 is a schematic perspective diagram illustrating the structure of a part of the memory finger MF. Note that FIG. 3 omits some of the structure from illustration. The structure shown in FIG. 3 is merely an example, and the specific structure thereof may be appropriately modified.

The memory finger MF includes a substrate 101, and a plurality of conductive layers 102 laminated on the substrate 101 along the Z direction. Also, the memory finger MF includes a plurality of memory shafts 105 that extend in the Z direction. The intersections of the conductive layers 102 and the memory shaft 105 function as the lowermost source side select gate transistor STSb, the source side select gate transistor STS, the memory cell MC, or the drain side select gate transistor STD. The conductive layer 102 is composed of a conductive layer such as tungsten (W) and polysilicon, and functions as, for example: the word line WL; a control gate electrode of the memory cell MC; the source side select gate line SGS; a control gate electrode of the source side select gate transistor STS; the drain side select gate line SGD; a control gate of the drain side select gate transistor STD; the lowermost source side select gate line SGSb; and a control gate electrode of the lowermost source side select gate transistor STSb.

The plurality of the conductive layers 102 are formed in a step-like manner at the ends in the X direction. That is, the conductive layer 102 includes a contact portion 102a that does not oppose to the lower surface of another conductive layer 102 located in the upper layer thereof. In addition, the conductive layer 102 is connected to a via contact wiring 109 (hereinafter referred to as "a contact 109") at the contact portion 102a. The upper end of the contact 109 is provided with a wiring 110. Note that the contact 109 and the wiring 110 are made of a conductive layer such as tungsten.

The memory finger MF includes a conductive layer 108. The conductive layer 108 opposes to the side surface in the Y direction of the plural conductive layers 102, and has a plate-like shape that extends in the X direction and the Z direction. Also, the lower end of the conductive layer 108 contacts the substrate 101. The conductive layer 108 is made of a conductive layer such as tungsten (W), and functions as the source contact LI.

Also, the memory finger MF includes a plurality of conductive layers 106 and a conductive layer 107 that are located above the plurality of conductive layers 102 and the memory shafts 105. The plurality of the conductive layers 106 and the conductive layer 107 are disposed in a plurality in the X direction, and extend in the Y direction. The memory shafts 105 are respectively connected to lower parts of the conductive layers 106. The conductive layer 106 is made of a conductive layer such as tungsten (W), and functions as a bit line BL. Also, the conductive layer 108 is connected to a lower part of conductive layer 107. The conductive layer 107 is made of a conductive layer such as tungsten (W), and functions, for example, as the source line SL.

Figure 4:
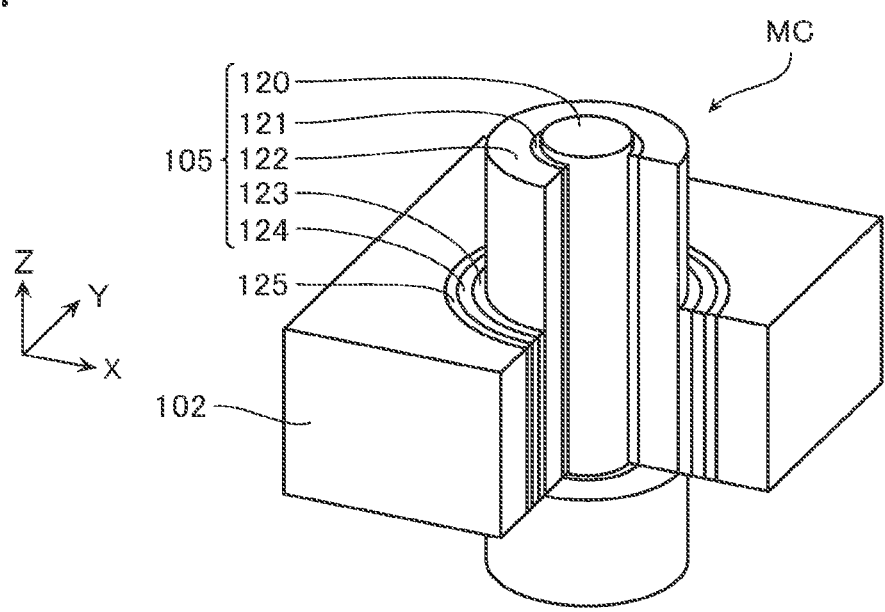
FIG. 4 is a perspective diagram showing a structure of apart of the nonvolatile semiconductor memory device according to the first embodiment.

Referring now to FIG. 4, a schematic structure of the memory cell MC will be described. FIG. 4 is a schematic perspective diagram illustrating the structure of the memory cell MC. Note that, in FIG. 4, some structure is omitted.

The memory cell MC is provided at the intersection of the conductive layer 102 and the memory shaft 105. The memory shaft 105 includes a core insulating layer 120, an oxide film layer 121, a semiconductor layer 122, a tunnel insulating layer 123, and a charge accumulation layer 124. In addition, a block insulating layer 125 is provided between the memory shaft 105 and the conductive layer 102.

The core insulating layer 120 is formed of an insulating layer such as silicon oxide ($SiO_2$). The core insulating layer 120 is an insulating layer formed by depositing silicon oxide in a cavity, for example, by a CVD method. Also, the oxide film layer 121 is an oxide film formed outside of the core insulating layer 120. Furthermore, the oxide film layer 121 contacts the semiconductor layer 122 on one side thereof that is opposite to a side where the semiconductor layer 122 contacts the tunnel insulating layer 123.

The core insulating layer 120 is disposed so that the oxide film layer 121 and the semiconductor layer 122 covers its periphery. In addition, the oxide film layer 121 is disposed between the core insulating layer 120 and the semiconductor layer 122. The oxide film layer 121 is a thermal oxide film (a silicon oxide film) which is formed by oxidizing the inner wall of the semiconductor layer 122 by thermal oxidation. When the core insulating layer 120 is formed by deposition such as CVD, and the oxide film layer 121 is formed by thermal oxidation, the density of the oxide film layer 121 may be larger than that of the core insulating layer 120.

The semiconductor layer 122 is formed of a semiconductor layer such as polysilicon, for example, and functions as a channel body of the memory cell MC. For example, the semiconductor layer 122 may be formed by depositing amorphous silicon as its material, and then, performing a heat process for crystallization to change the amorphous silicon to polysilicon. The tunnel insulating layer 123 is formed of an insulating layer such as silicon oxide ($SiO_2$). The charge accumulation layer 124 is formed of an insulating layer that may accumulate electric charges such as silicon nitride (SiN). The block insulating layer 125 is made of an insulating layer such as silicon oxide ($SiO_2$), for example. Although illustration is omitted in FIG. 4, a high dielectric film including alumina ($Al_2O_3$) may be provided between the block insulating layer 125 and the conductive layer 102, for example. Description hereinbelow explains an example that does not include a high dielectric film, but it is needless to say that this example does not limit the subject matter of the present embodiment.

Figure 5A:
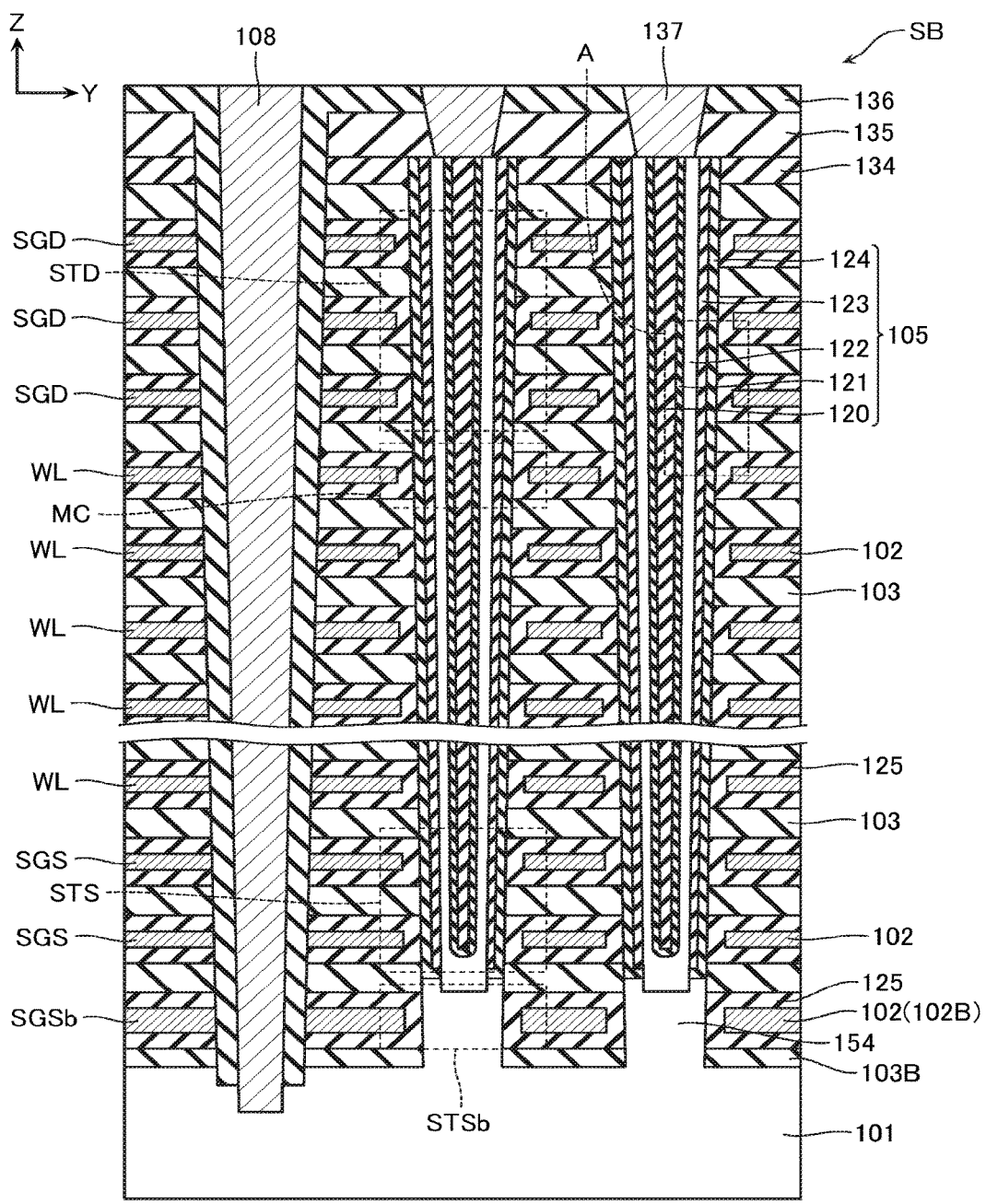
FIGS. 5A and 5B are sectional views showing a structure of a part of the nonvolatile semiconductor memory device according to the first embodiment.
Figure 5B:
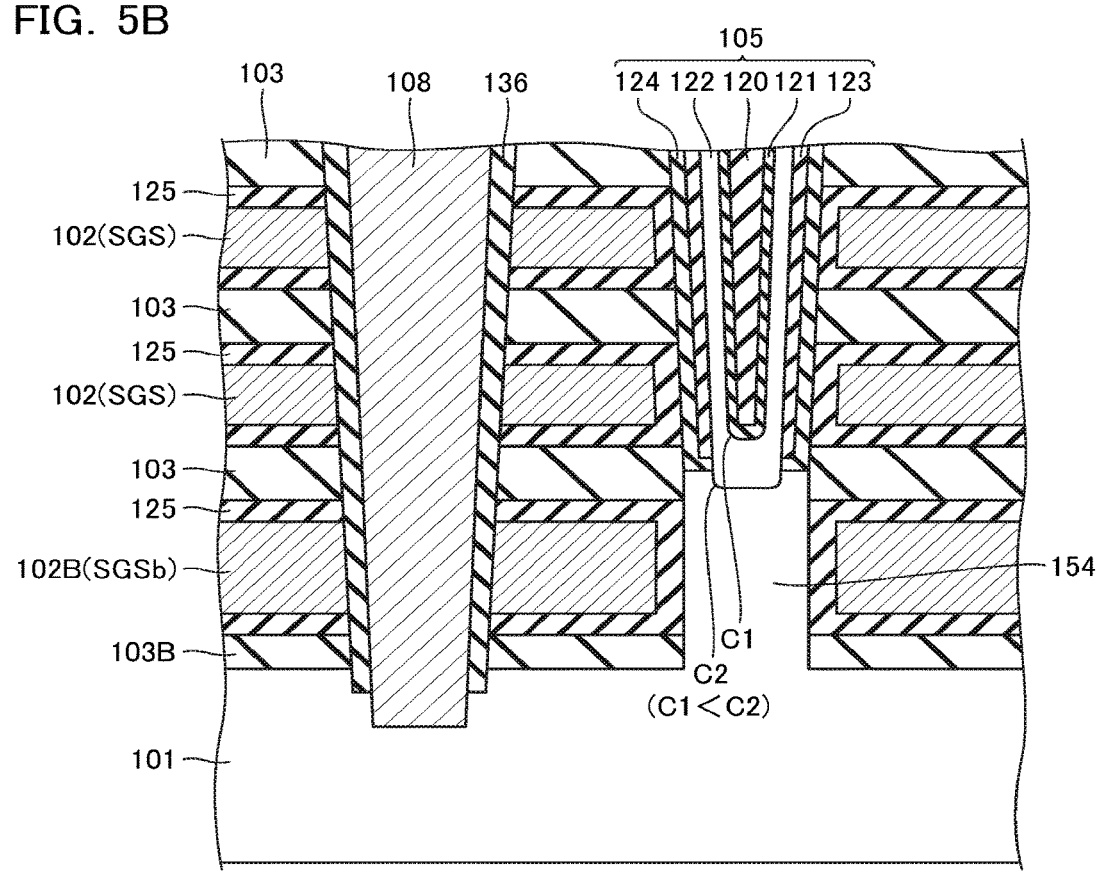

Next, with reference to FIGS. 5A and 5B, a nonvolatile semiconductor memory device according to the present embodiment will be described more in detail. FIG. 5A is a sectional view illustrating a structure of part of the nonvolatile semiconductor memory device, and FIG. 5B is a partial enlarged view thereof.

The nonvolatile semiconductor memory device according to the present embodiment includes a substrate 101 (a silicon substrate), a stacked body SB provided on the substrate 101, memory shafts 105 and a conductive layer 108.

The stacked body SB includes a plurality of conductive layers 102 laminated on the substrate 101. These plurality of conductive layers 102 function as control gates of the memory cells MS, the word lines WL, the select gate lines of the select transistor STD, STS, and STSb, respectively. The stacked body SB includes a plurality of conductive layers 102 and a plurality of interlayer insulating layer 103 disposed therebetween. In other words, the stacked body SB includes a plurality of conductive layers 102 and a plurality of interlayer insulating layers 103 provided alternately along the Z direction on the substrate 101.

In addition, the stacked body SB includes the block insulating layer 125 that covers the top surface, the lower surface, and the side surface of the conductive layer 102. The conductive layer 102 is formed of a conductive material such as tungsten (W), for example, and functions as a control gate of the memory cell MC, the word line WL, or the like.

In addition, the interlayer insulating layer 103 and the block insulating layer 125 are formed of an insulating material such as silicon oxide ($SiO_2$)

An insulating layer 134, an insulating layer 135 and 136 are deposited in this order on a further upper layer of the uppermost interlayer insulating layer 103. In addition, a bit line contact 137 is disposed so as to penetrate these insulating layers 134, 135 and 136 to reach the memory shaft 105. The bit line contact 137 is connected, at the upper end thereof,'to the bit line BL (conductive layer 106) which is not illustrated.

A conductive layer 102B that is one of the conductive layers 102 and located in the lowermost layer in the stacked body SB functions as a lowermost source side select gate line SGSb. In addition, an interlayer insulating layer 103B is disposed between the conductive layer 102B and the substrate 101. Due to this, the conductive layer 102B is adjacent to the substrate 101 via the interlayer insulating layer 103B.

In addition, plural (for example, two) conductive layers located above the conductive layer 102B function as the source side select gate line SGS (a gate electrode of the source side select gate transistor STS). Furthermore, plural (for example, three) conductive layers located in the upper part of the stacked body SB function as the drain side select gate line SGD (a gate electrode of the drain side select gate transistor STD).

As already explained with reference to FIG. 4, the memory shaft 105 includes the core insulating layer 120 extending in the Z direction, the oxide film layer 121, the semiconductor layer 122, the tunnel insulating layer 123, and the charge accumulation layer 124. The semiconductor layer 122, the tunnel insulating layer 123, and the charge accumulation layer 124 covers the sidewall of the core insulating layer 120 in this order. The memory shaft 105 includes a semiconductor layer 122 extending in the Z direction that is perpendicular to the substrate 101. This semiconductor layer 122 functions as channel bodies of the memory cells MC and the like. The core insulating layer 120 and the oxide film layer 121 are formed of an insulating material such as silicon oxide ($SiO_2$), for example. However, while the core insulating layer 120 is a silicon oxide film deposited by a deposition method such as CVD, the oxide film layer 121 is a thermal oxide film which is formed by oxidizing the inner wall of the semiconductor layer 122 by a heat process. Thus, the density of the oxide film layer 121 is larger than the density of the core insulating layer 120.

FIG. 5B is an enlarged view of the lower end portion of the memory shaft 105. As shown in FIG. 5B, the oxide film layer 121 has a certain curvature C1 at the lower end thereof. This curvature C1 is smaller than the curvature C2 of the lower end of the semiconductor layer 122. This is because the oxide film layer 121 is configured by thermal-oxidization of the inner wall of the semiconductor layer 122. Since the oxide film layer 121 has such a small curvature C1 at the lower end thereof, the stress of the semiconductor layer 122 may be relaxed, and junction leak may be reduced.

The semiconductor layer 122 is formed, for example, of a semiconductor such as polysilicon, and functions as channel bodies of the memory cell MC or the like. The tunnel insulating layer 123 is formed, for example, of an insulating layer such as silicon oxide ($SiO_2$). The charge accumulation layer 124 is formed of an insulating layer such as silicon nitride (SiN) which may accumulate electric charges.

The memory shaft 105 is connected, at the lower part thereof, to the semiconductor layer 154. The semiconductor layer 154 is formed integrally with the substrate 101, and extends in the Z direction. The semiconductor layer 154 is formed of monocrystalline silicon or the like, and functions as a channel of the lowermost source side select gate transistor SBSb. The semiconductor layer 122 is connected to the upper part of the semiconductor layer 154.

Figure 6:
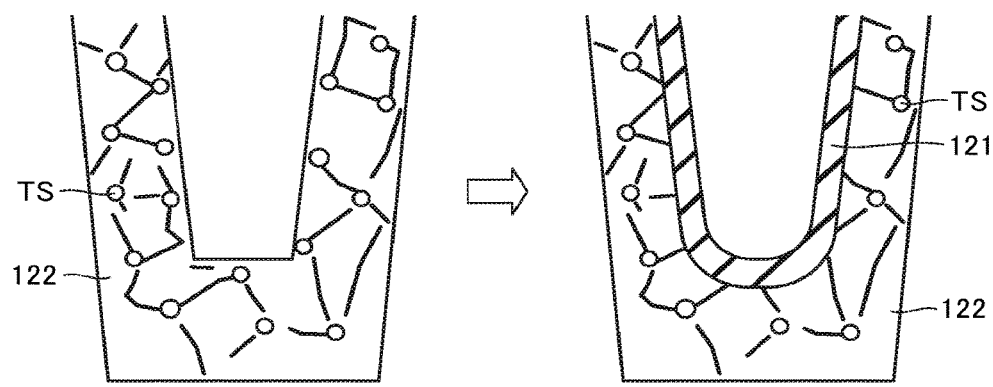
FIG. 6 shows an advantage of the first embodiment.

Referring now to FIG. 6, the advantage caused by forming the oxide film layer 121 in this first embodiment will be described.

When the semiconductor layer 122 is formed thicker in consideration of forming the oxide film layer 121, many trap sites are left in polysilicon included in the semiconductor layer 122. If the number of the trap sites TS is large, variation $\Delta Vth$ in the threshold voltage Vth of the memory cells MC increases, and the performance of the semiconductor memory device will deteriorate.

However, when the oxide film layer 121 is formed by thermal oxidation like in the present embodiment, the trap sites TS disappear as the oxide film layer 121 increases, thereby the number of trap sites TS decreases. This causes the variation $\Delta Vth$ in the threshold voltage Vth among the plural memory cells MC may be decreased. In addition to such an advantage, as described above, forming the oxide film layer 121 may cause the curvature C1 of the oxide film layer 121 to become smaller than the curvature C2 of the lower end of the semiconductor layer 122. Due to this, stress of the semiconductor layer 122 is relaxed, and junction leak can be thereby reduced.

In addition, by forming the semiconductor layer 122 thicker, and thermally oxidizing it partly to form the oxide film layer 121, the crystal grain size of polysilicon included in the semiconductor layer 122 may be larger compared to when the oxide film layer 121 is not formed. This may improve the mobility of the semiconductor layer 122.

[Manufacturing Method]

Referring now to FIGS. 7 to 15, a method of manufacturing the nonvolatile semiconductor memory device according to the present embodiment will be described.

Figure 7:
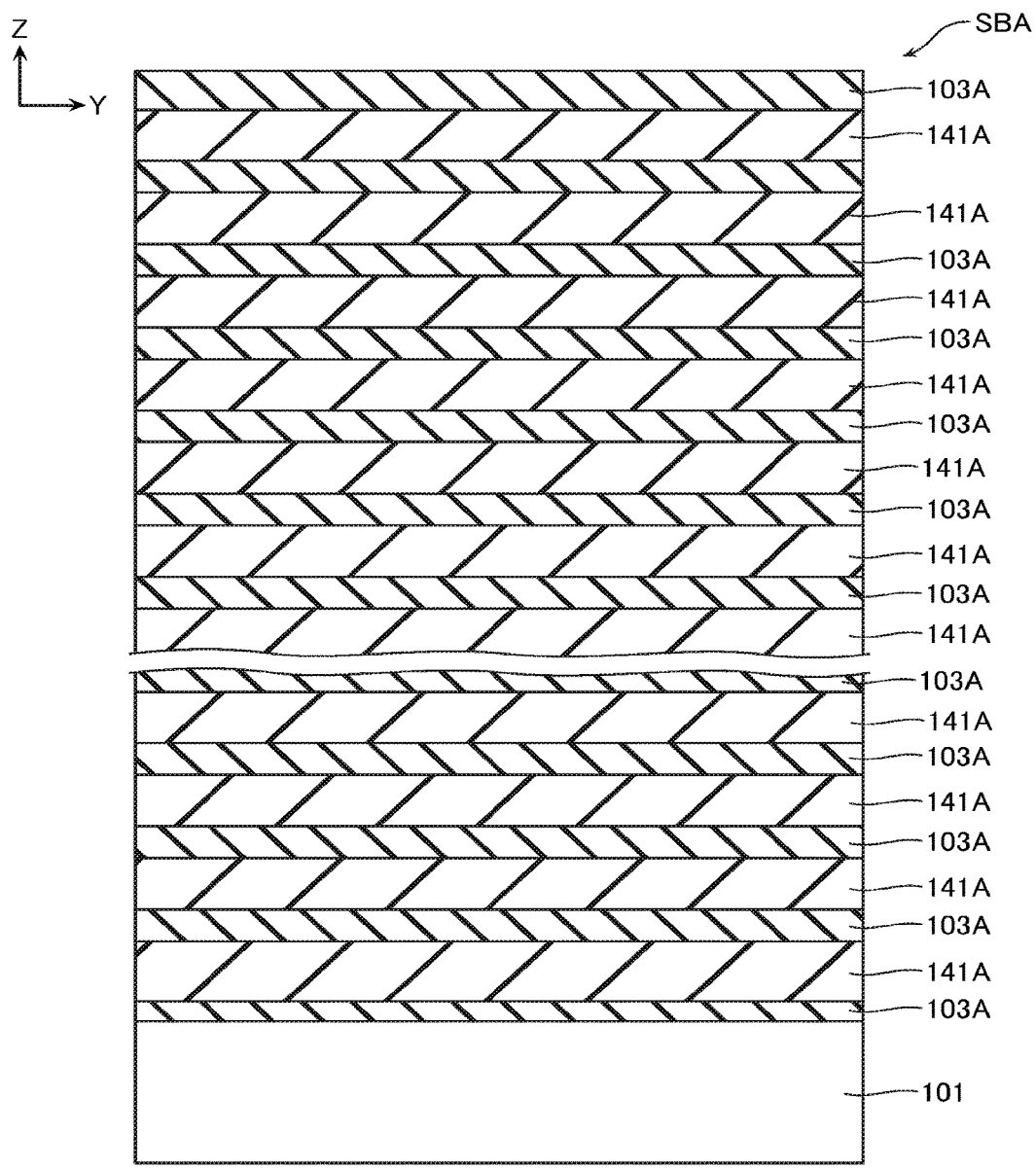
FIG. 7 to FIG. 17 are process charts that illustrate a manufacturing method of the nonvolatile semiconductor memory device according to the first embodiment.

As shown in FIG. 7, an interlayer insulating layers 103A and a sacrifice layers 141A are alternately deposited on the substrate 101 to form a stacked body SBA.

The interlayer insulating layer 103A is a layer that will become the above-mentioned interlayer insulating layers 103 or 103B. In addition, the sacrifice layer 141A is a film which is removed by etching by the later-described process. The conductive layers 102 are respectively formed in cavities which are formed after the removal of the sacrifice layers 141A. The interlayer insulating layer 103A is formed of silicon oxide ($SiO_2$), for example. The sacrifice layer 141A is formed of silicon nitride (SiN), for example.

Figure 8:
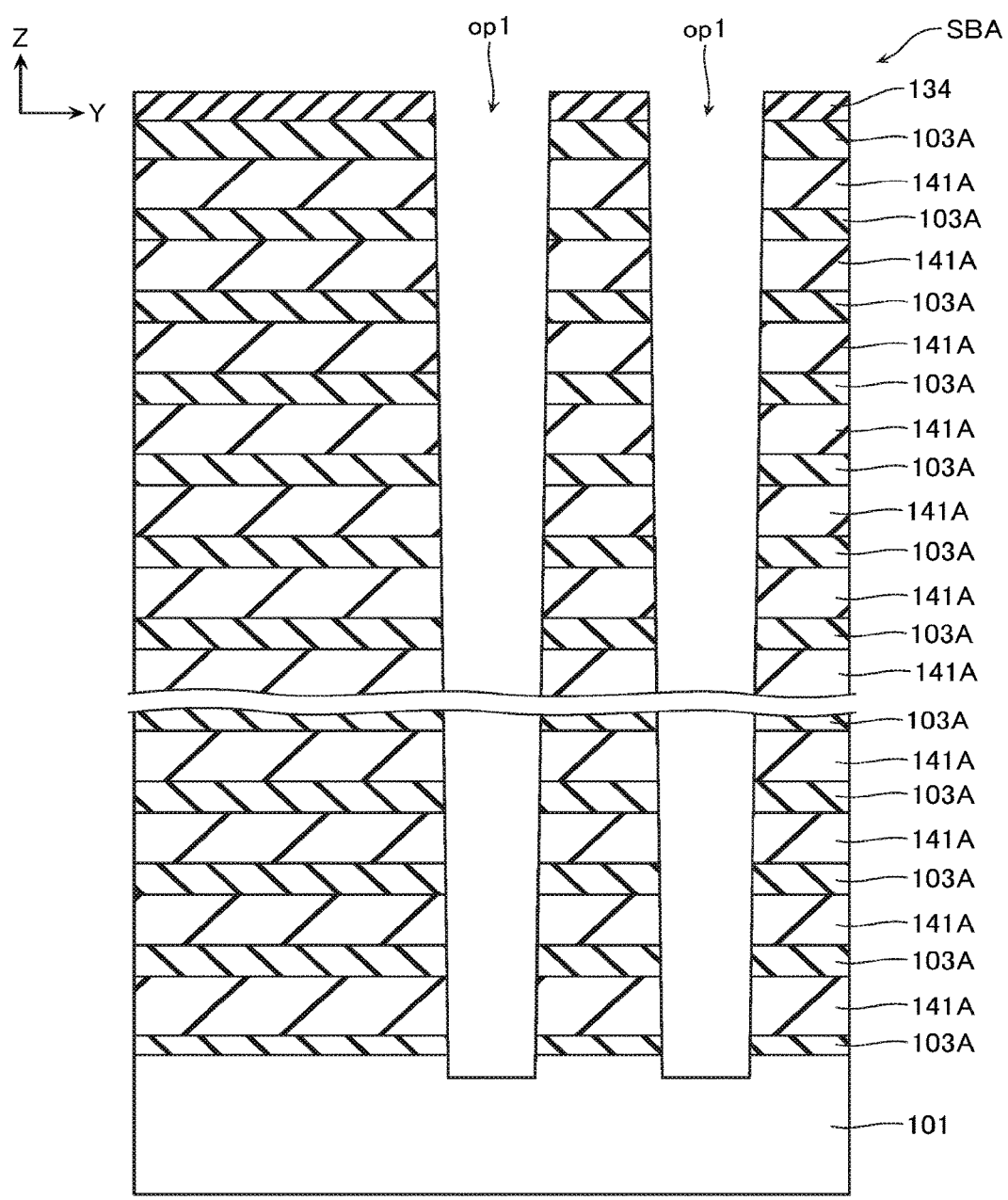

Next, as shown in FIG. 8, openings op1 are formed in the stacked body SBA. The above-mentioned memory units MU are formed in these openings op1. After forming an insulating layer 134 on the upper surface of the stacked body SBA, anisotropic etching such as RIE (Reactive Ion Etching) is performed using the insulating layer 134 as a mask to form the openings op1 in the stacked body SBA. The openings op1 are formed to penetrate the interlayer insulating layer 103A and the sacrifice layers 141A and reach the substrate 101.

Figure 9:
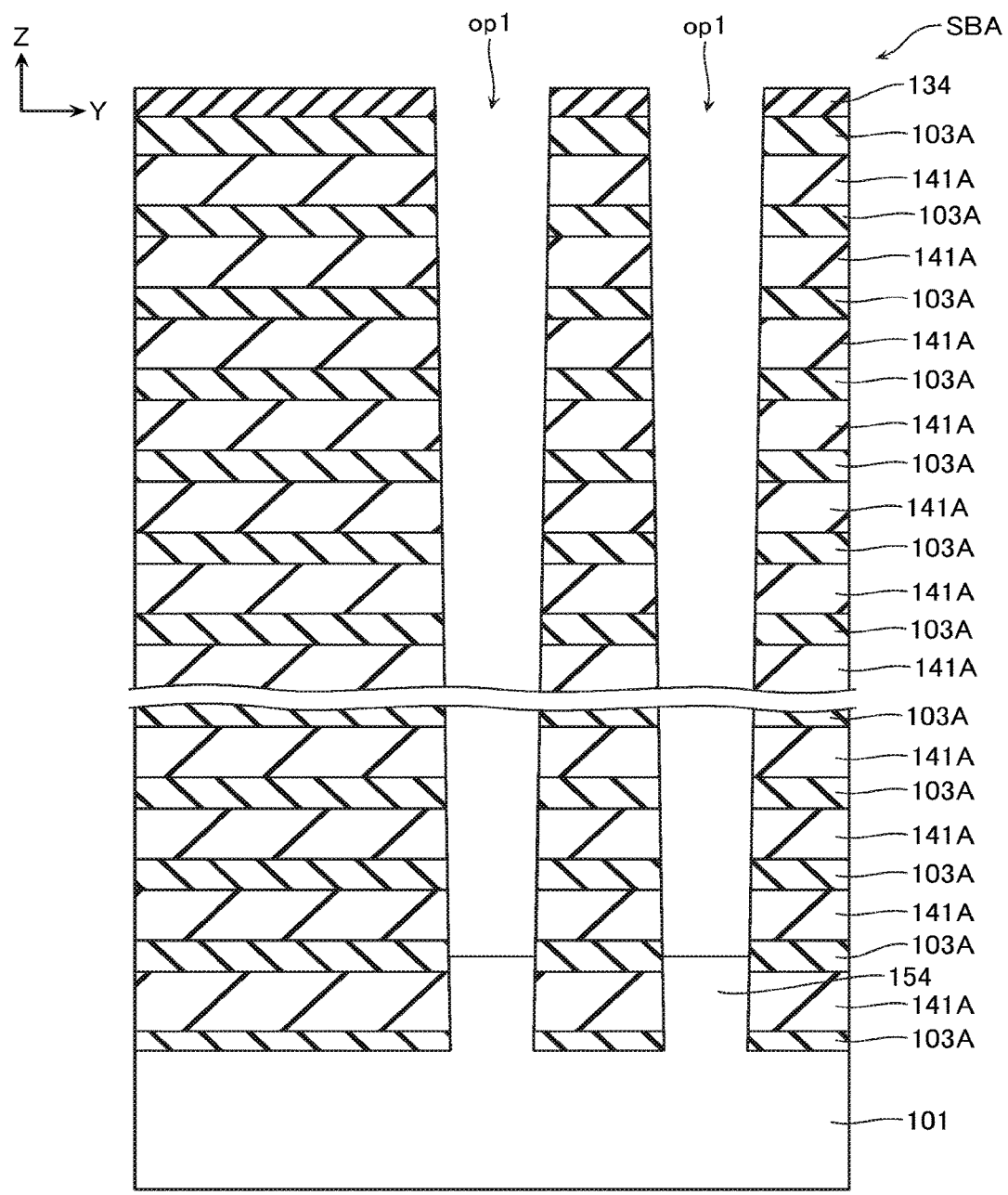

Then, as shown in FIG. 9, crystal growth such as epitaxial growth is performed to form a semiconductor layer 154 in the bottom of the openings op1 to a certain height. The semiconductor layer 154 is monocrystalline silicon that is integrally formed with the substrate 101.

Figure 10:
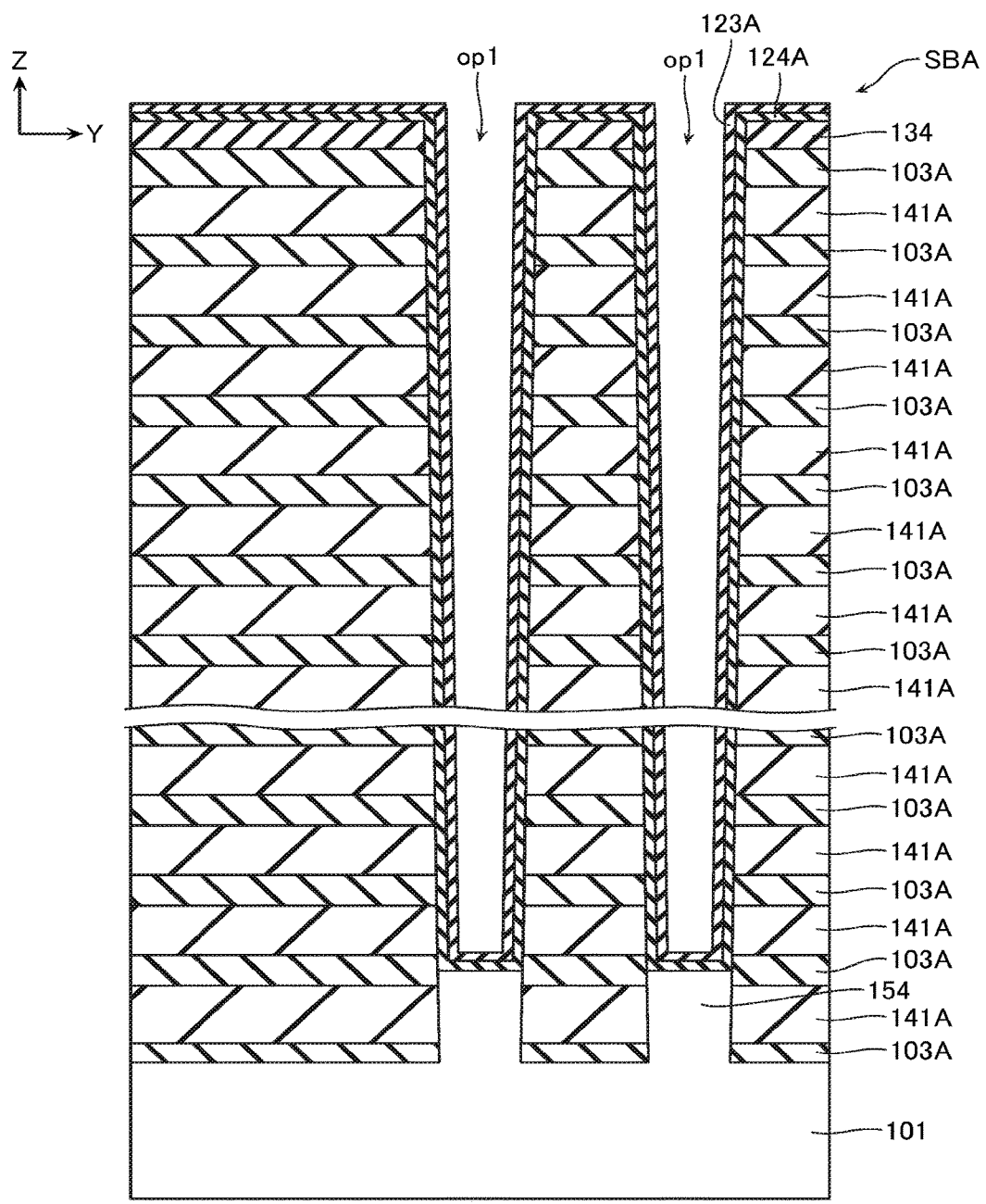

Next, as shown in FIG. 10, a charge accumulation layer 124A that will become the charge accumulation layer 124, and a tunnel insulating layer 123A that will become the tunnel insulating layer 123 are formed on the inner wall and the bottom of the openings op1, and on the top surface of the stacked body SBA. The charge accumulation layer 124A is formed of silicon nitride (SiN), for example. The insulating layer 123A is formed of silicon oxide (SiO$_2$), for example.

Figure 11:
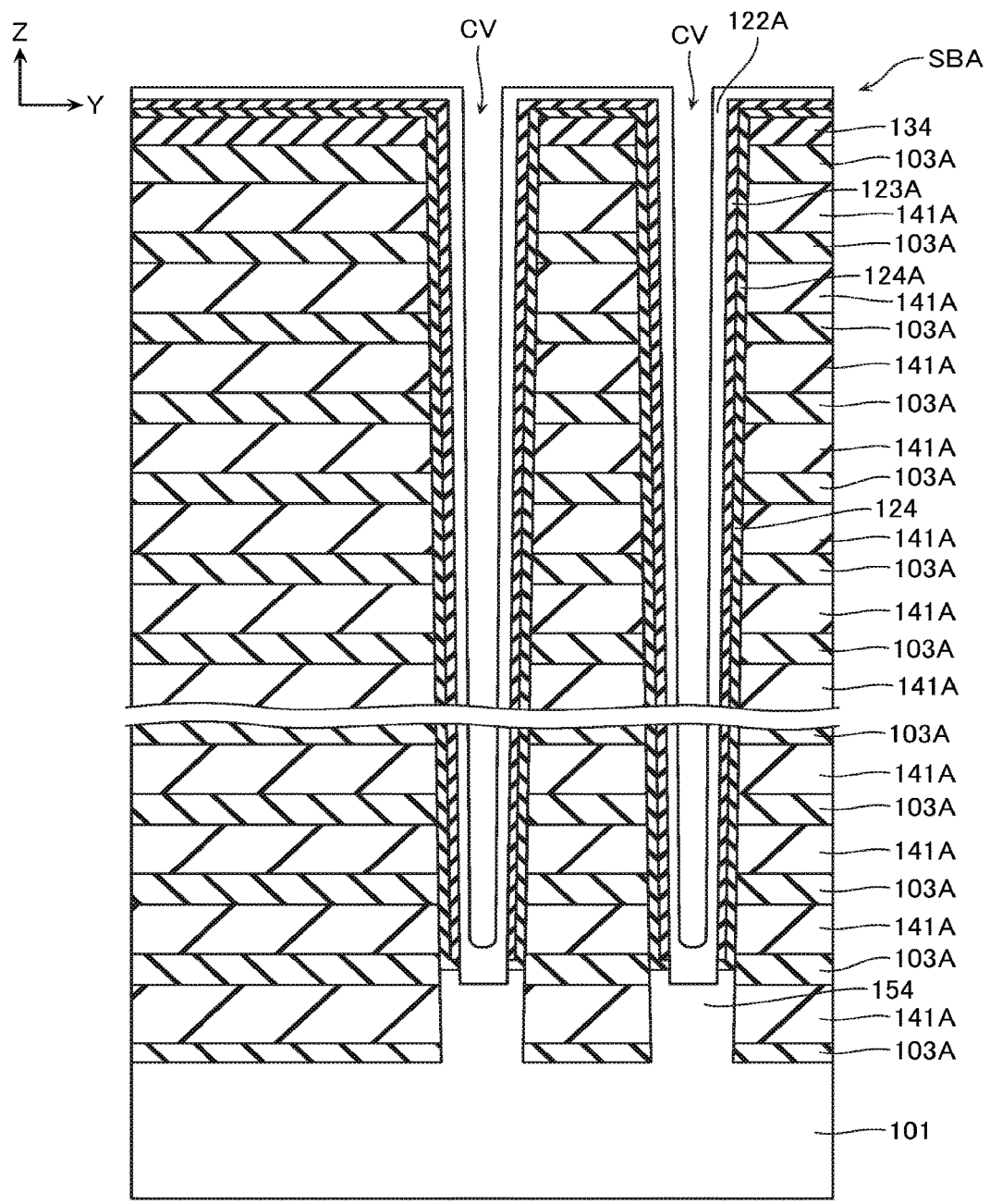

Then, as shown in FIG. 11, after removing the charge accumulation layer 124A and the insulating layer 123A deposited on the bottom of the openings op1 by RIE, a semiconductor layer 122A is formed on the inner wall and the bottom of the openings op1, and on the top surface of the stacked body SBA. The semiconductor layer 122A serves as a material of the above-mentioned semiconductor layer 122, and is formed of amorphous silicon, for example. The semiconductor layer 122A is deposited while leaving a cavity CV therein.

Figure 12:
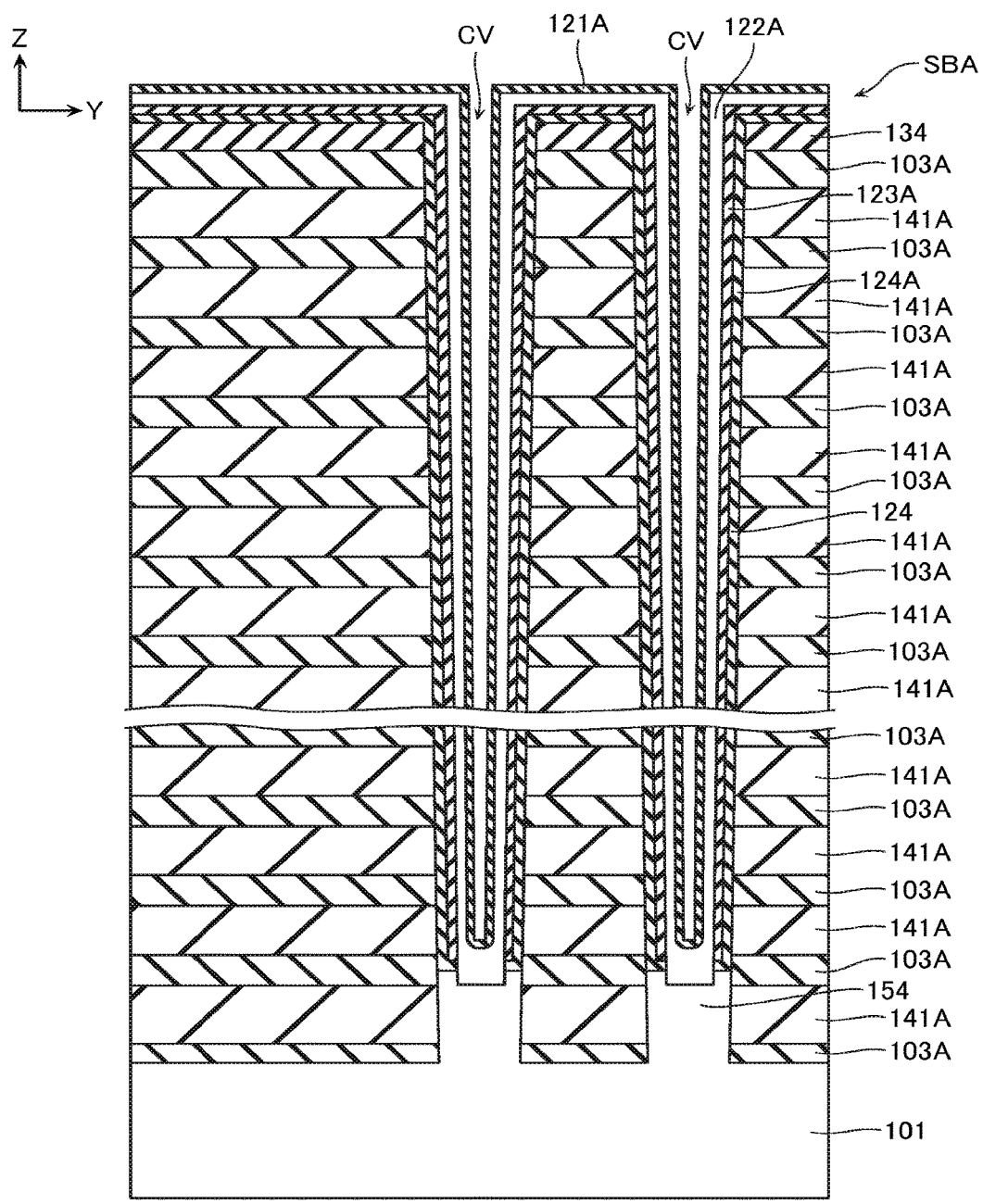

Then, as shown in FIG. 12, a heat process is performed on this semiconductor layer 122A to oxidize the surface of the semiconductor layer 122A, thereby forming an oxide film layer 121A. This oxide film layer 121A is a film that will become the previously-described oxide film layer 121.

Figure 13:
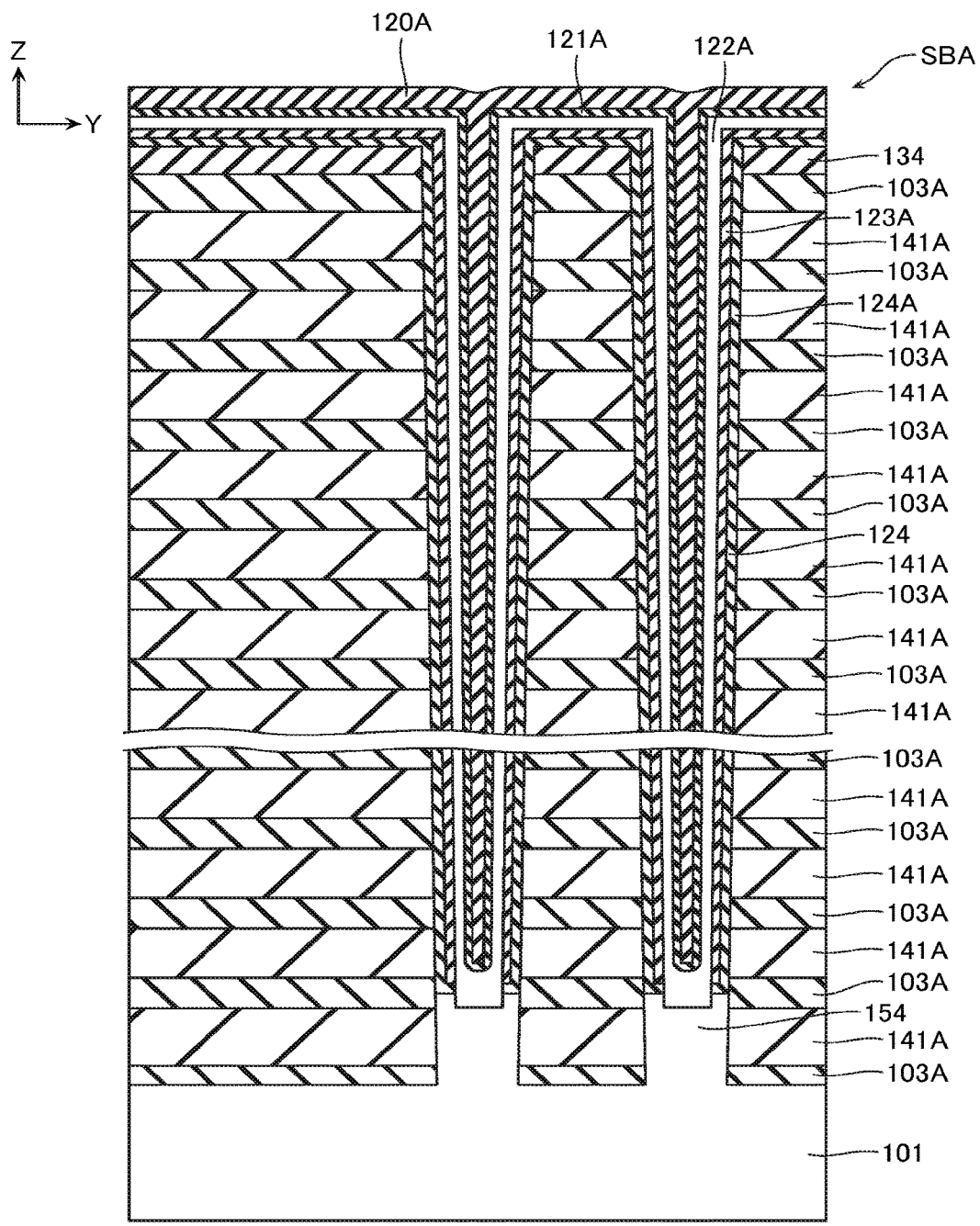

Next, as shown in FIG. 13, a core insulating layer 120A is embedded in the openings op1 to bury the cavity CV. Then, using the insulation layer 134 or the like as a stopper, CMP (Chemical Mechanical Polishing) is performed to planarize the insulating layer 134. A heat process is further performed to cause the crystalline structure of the semiconductor layer 122A in an amorphous state to change to a polycrystalline structure.

Figure 14:
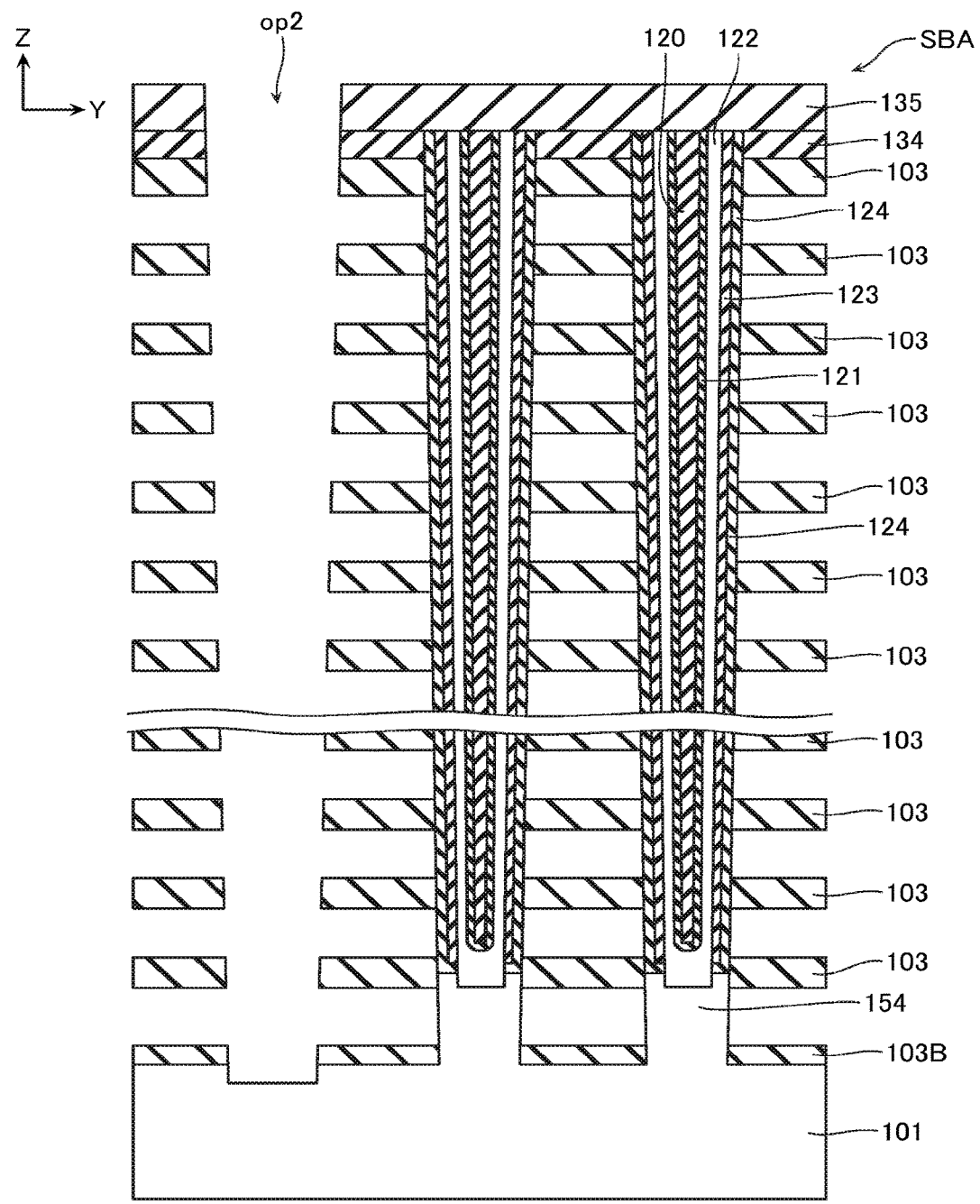

Furthermore, as shown in FIG. 14, an insulating layer 135 is formed on the top surface of the stacked body SBA, and anisotropic etching such as RIE is performed using the insulating layer 135 as a mask to form a trench op2 that penetrates the stacked body SBA. The previously-described source contact LI is formed in this trench op2. Then, for example, wet etching using phosphoric acid solution is performed, for example. This etching removes the sacrifice layers 141A and 141B to obtain a state of FIG. 14.

Figure 15:
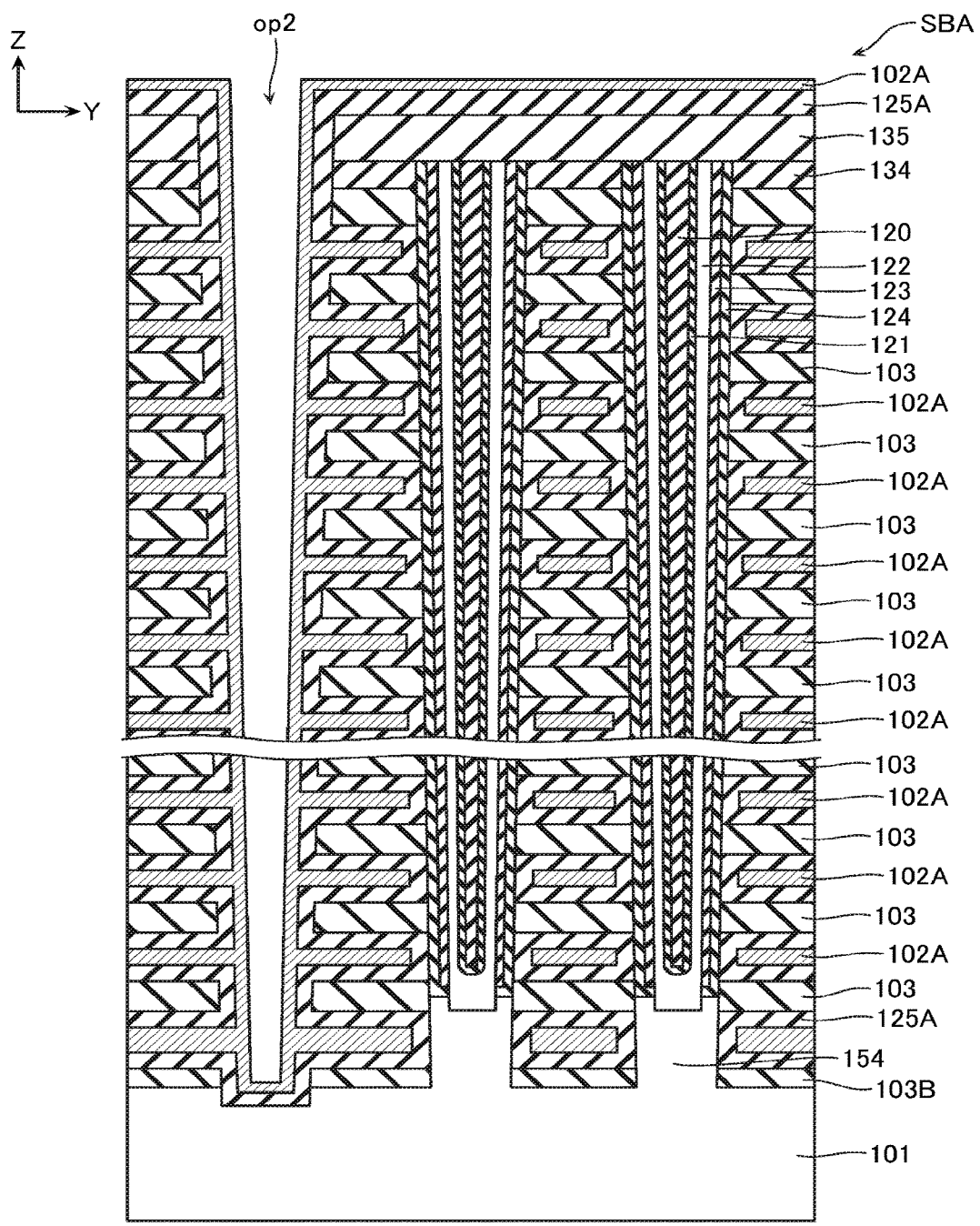

Subsequently, as shown in FIG. 15, an insulating layer 125A and a conductive layer 102A are deposited, using CVD or the like, along the inner wall of the trench op2, and along the inner wall of the cavity formed after removing the sacrifice layers 141A and 141B. The insulating layer 125A is an insulating film that will become the above-mentioned block insulating layer 125, and the conductive layer 102A is a layer that will become the above-mentioned conductive layer 102.

Figure 16:
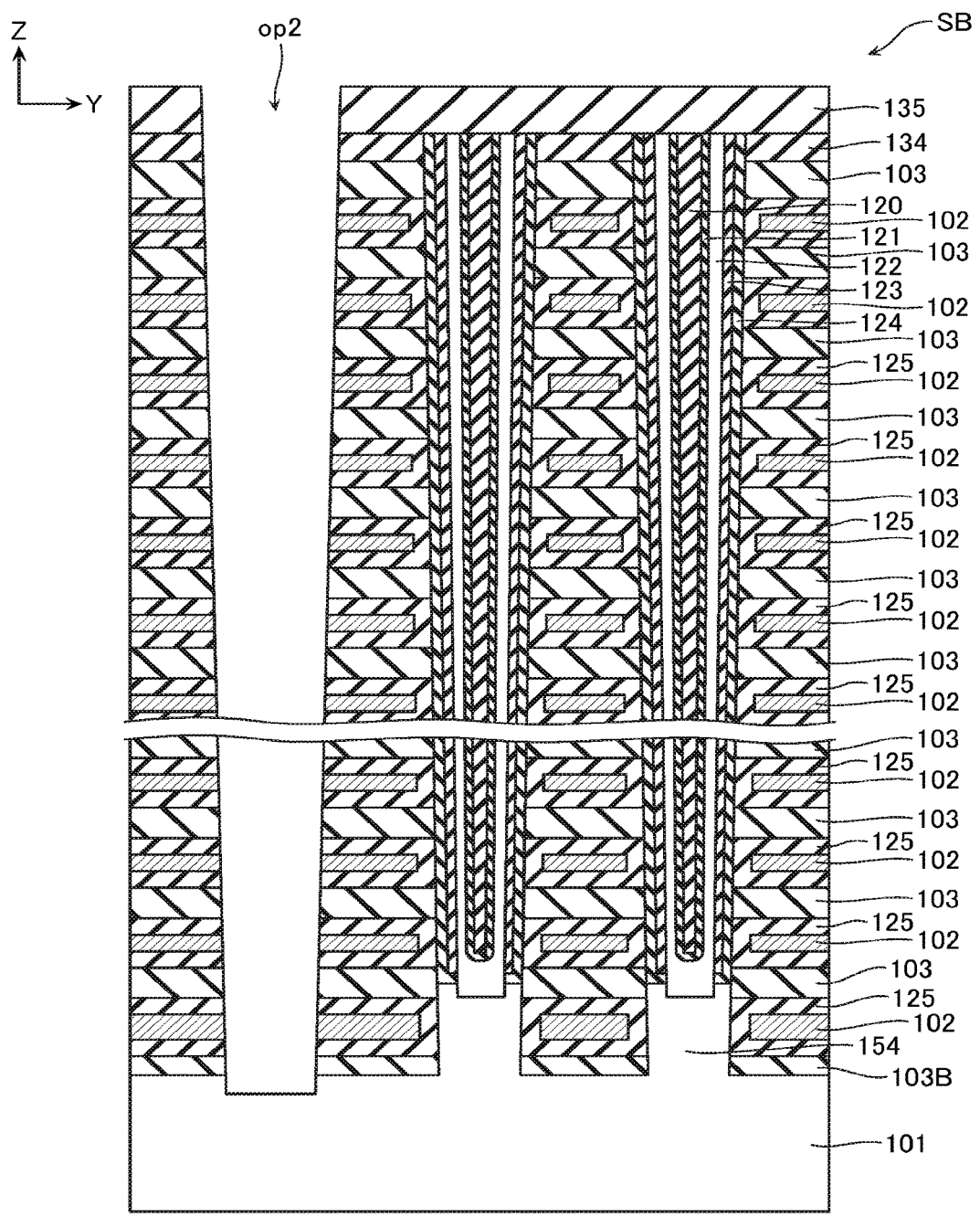
Figure 17:
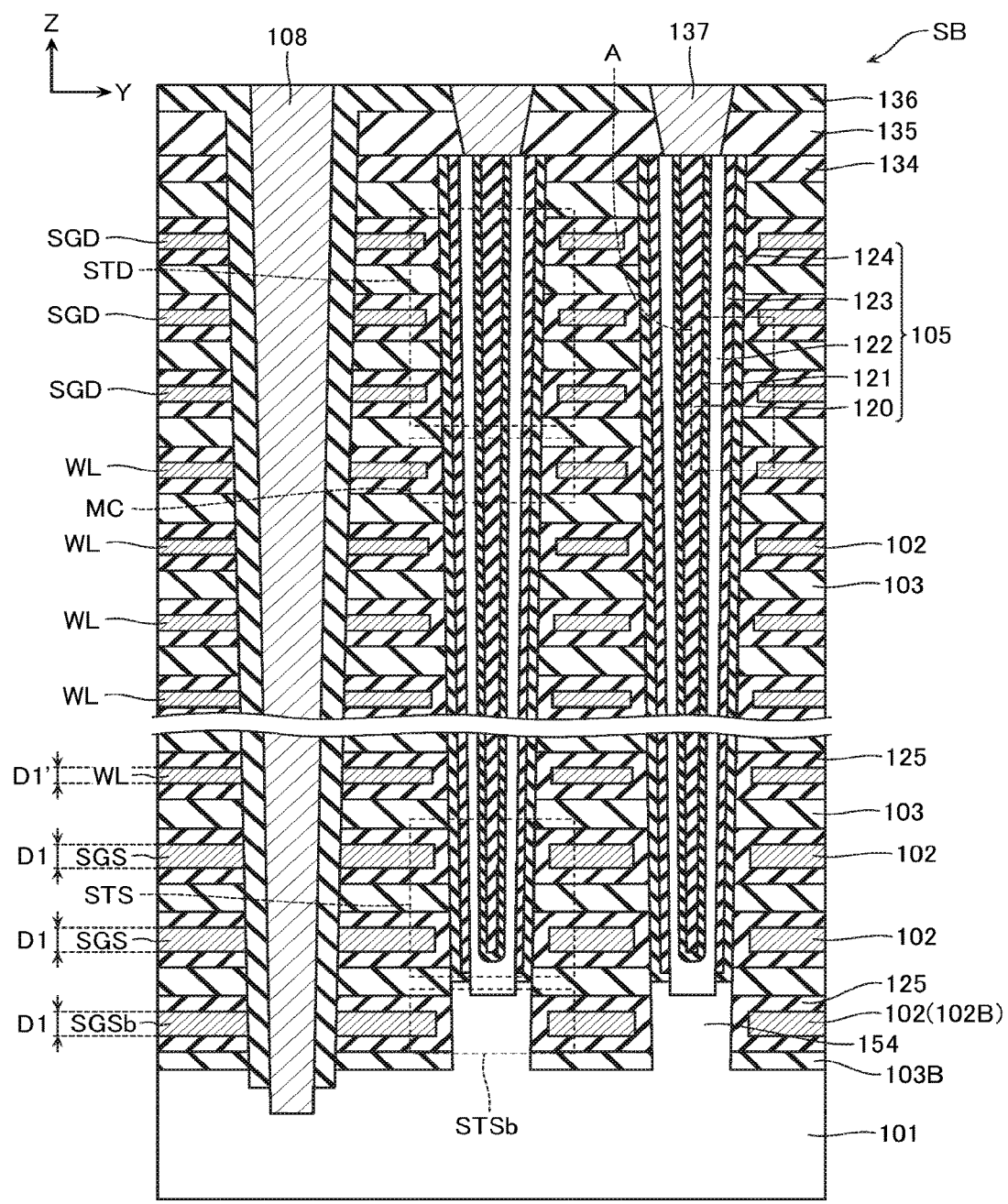

Then, as shown in FIG. 16, the insulating layer 125A and the conductive layer 102A that are formed on the top surface of the insulating layer 135 and on the sidewall of the trench op2 are removed by wet etching or the like. This process causes the conductive layer 102A not to be short-circuited to each other in the stacking direction, and forms the conductive layers 102. Then, as shown in FIG. 17, an insulating layer 136 and a conductive layer 108 is embedded in the trench op2, and a bit line contact 137 is further formed to complete the structure shown in FIG. 5A.

[Second Embodiment]

Figure 18:
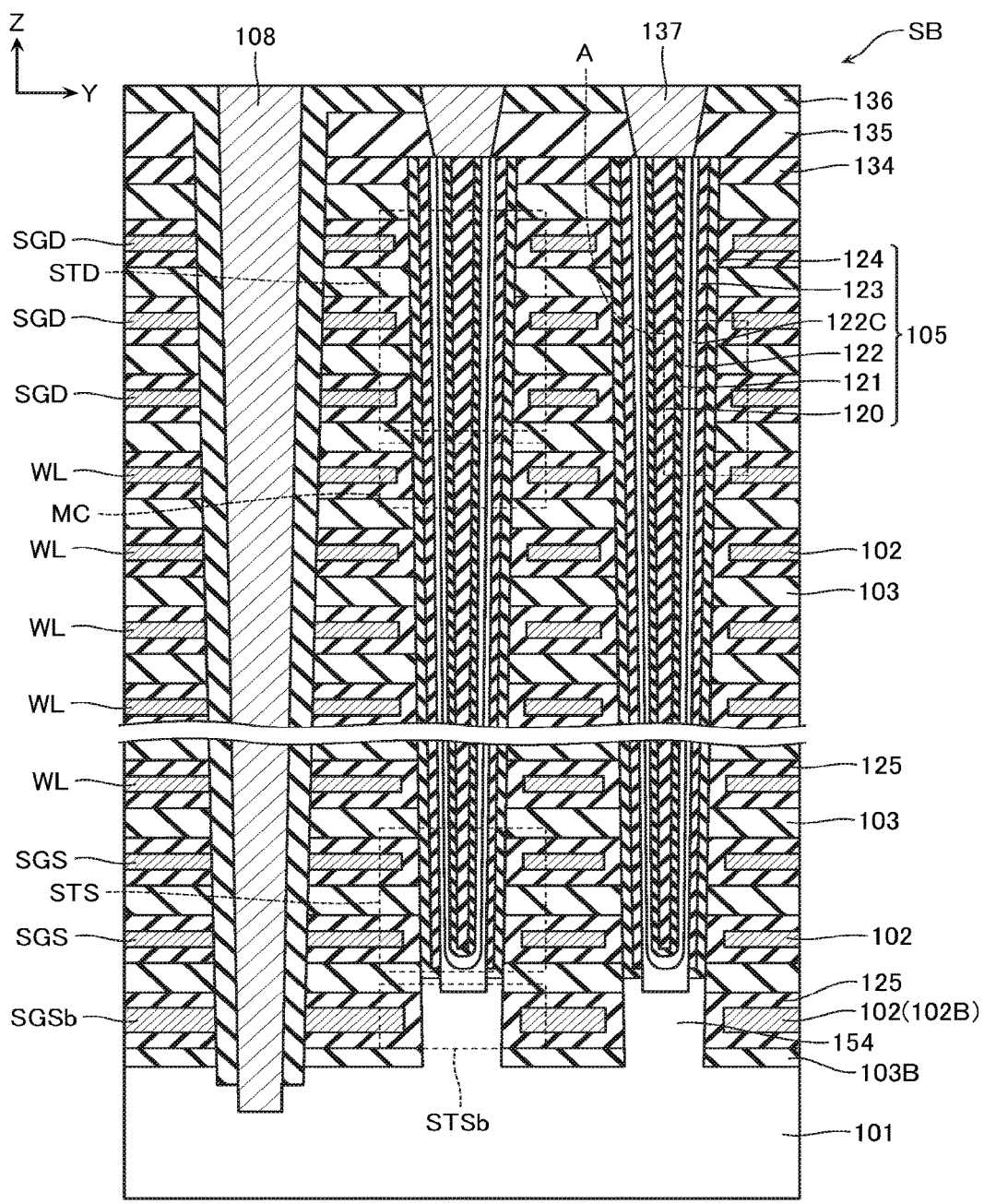
FIG. 18 is a sectional view showing a structure of apart of the nonvolatile semiconductor memory device according to a second embodiment.

Next, with reference to FIG. 18, the structure of the nonvolatile semiconductor memory device according to a second embodiment will be described. The entire structure of the second embodiment is similar to that of the first embodiment (FIG. 1 to FIG. 4). However, in this second embodiment, as shown in FIG. 18, a cover layer 122C which uses polysilicon as its material is provided between the semiconductor layer 122 and the tunnel insulating layer 123. This is different from the first embodiment.

A method of manufacturing the nonvolatile semiconductor memory device according to the second embodiment will be described with reference to FIG. 19 to FIG. 22.

Figure 19:
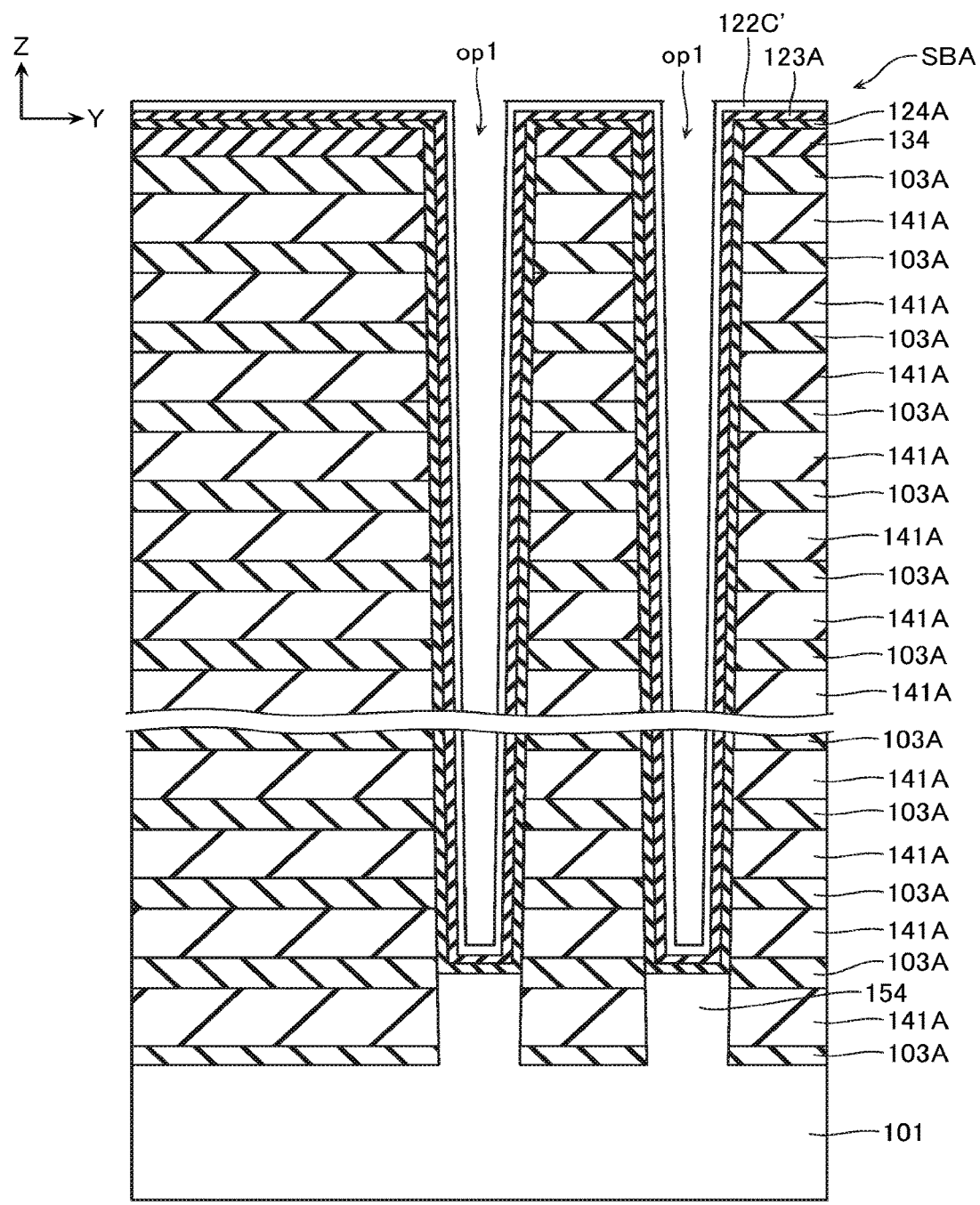
FIG. 19 to FIG. 22 are process charts that illustrate a manufacturing method of the nonvolatile semiconductor memory device according to the second embodiment.

After performing the processes shown in FIG. 7 to FIG. 10 in a similar way to the first embodiment, as shown in FIG. 19, a cover film 122C' that will become the above-mentioned cover film 122 is formed using CVD or the like, on the inner wall and the bottom of the opening op1, and on the top surface of the stacked body SBA. The cover film 122C' is formed of amorphous silicon, for example. The cover film 122C' is deposited while leaving a cavity therein.

Figure 20:
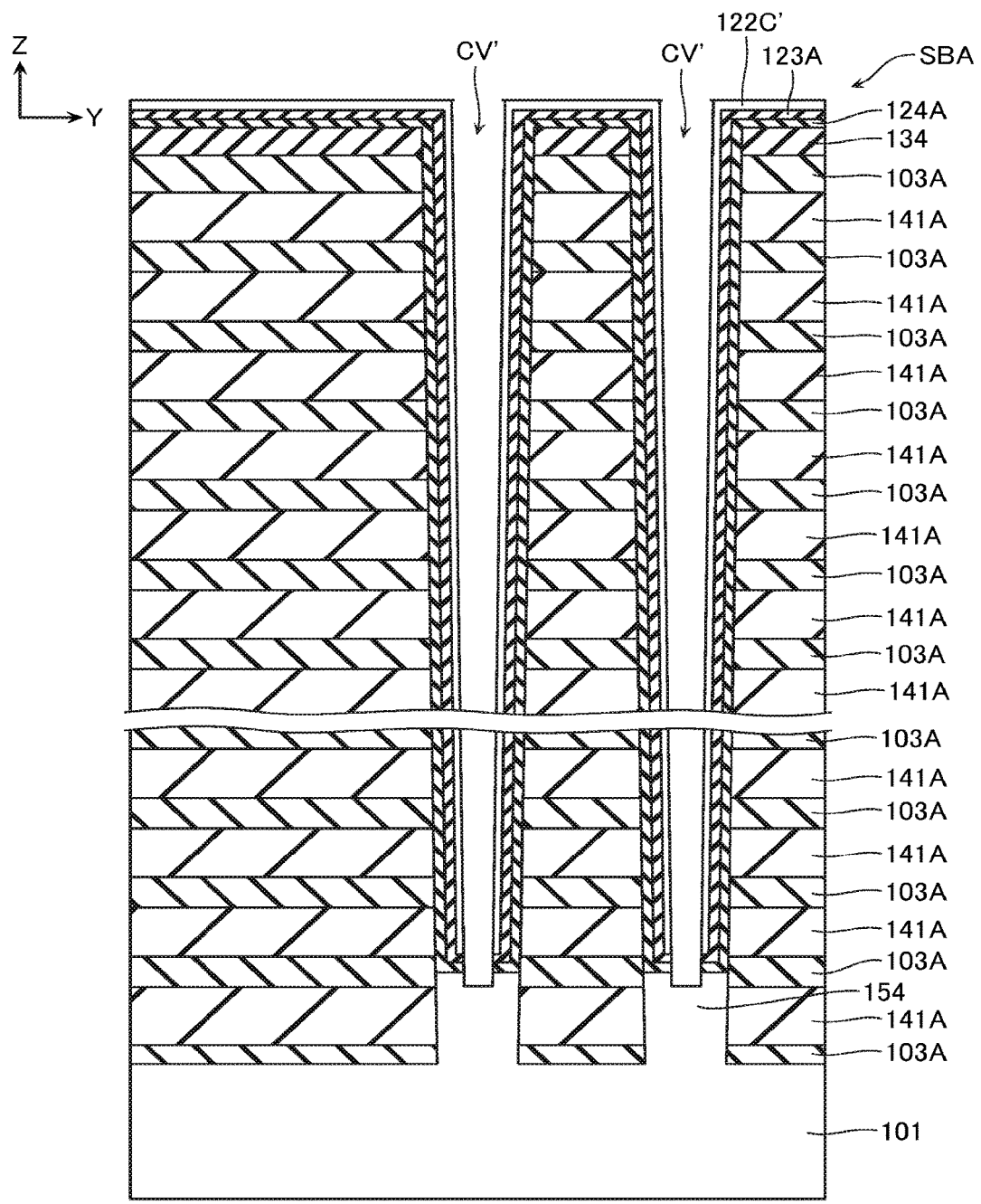
Figure 21:
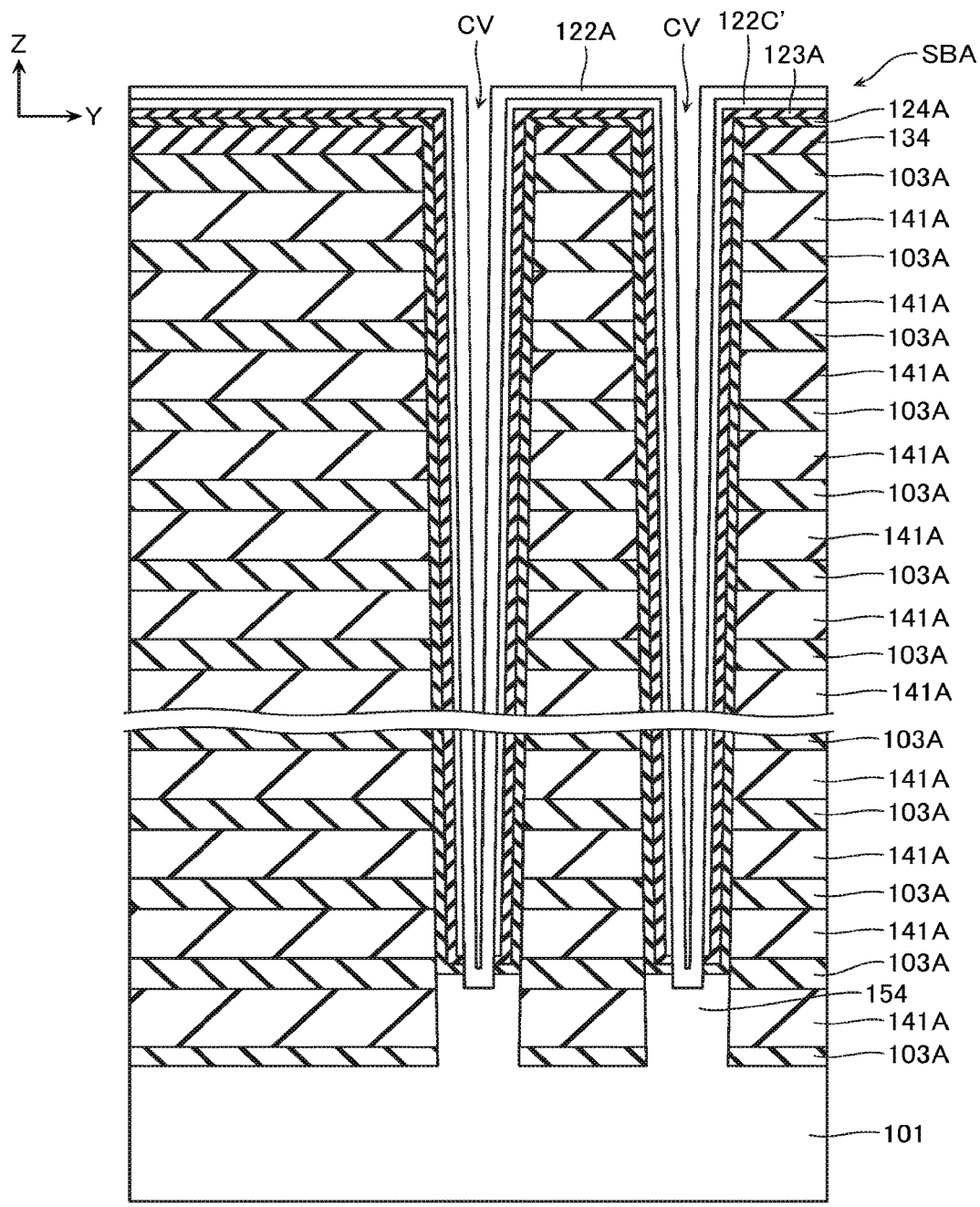

Next, as shown FIG. 20, a charge accumulation layer 124A, an insulating layer 123A and the cover film 122C' that are deposited on the bottom of the opening op1 is removed by RIE. Thereafter, as shown in FIG. 21, the semiconductor layer 122A is formed on the inner wall and the bottom of the opening op1 and on the upper surface of the stacked body SBA. The semiconductor layer 122A is formed of the material of the above-mentioned semiconductor layer 122, for example, amorphous silicon. Note that the semiconductor layer 122A is deposited while leaving a cavity CV therein.

Figure 22:
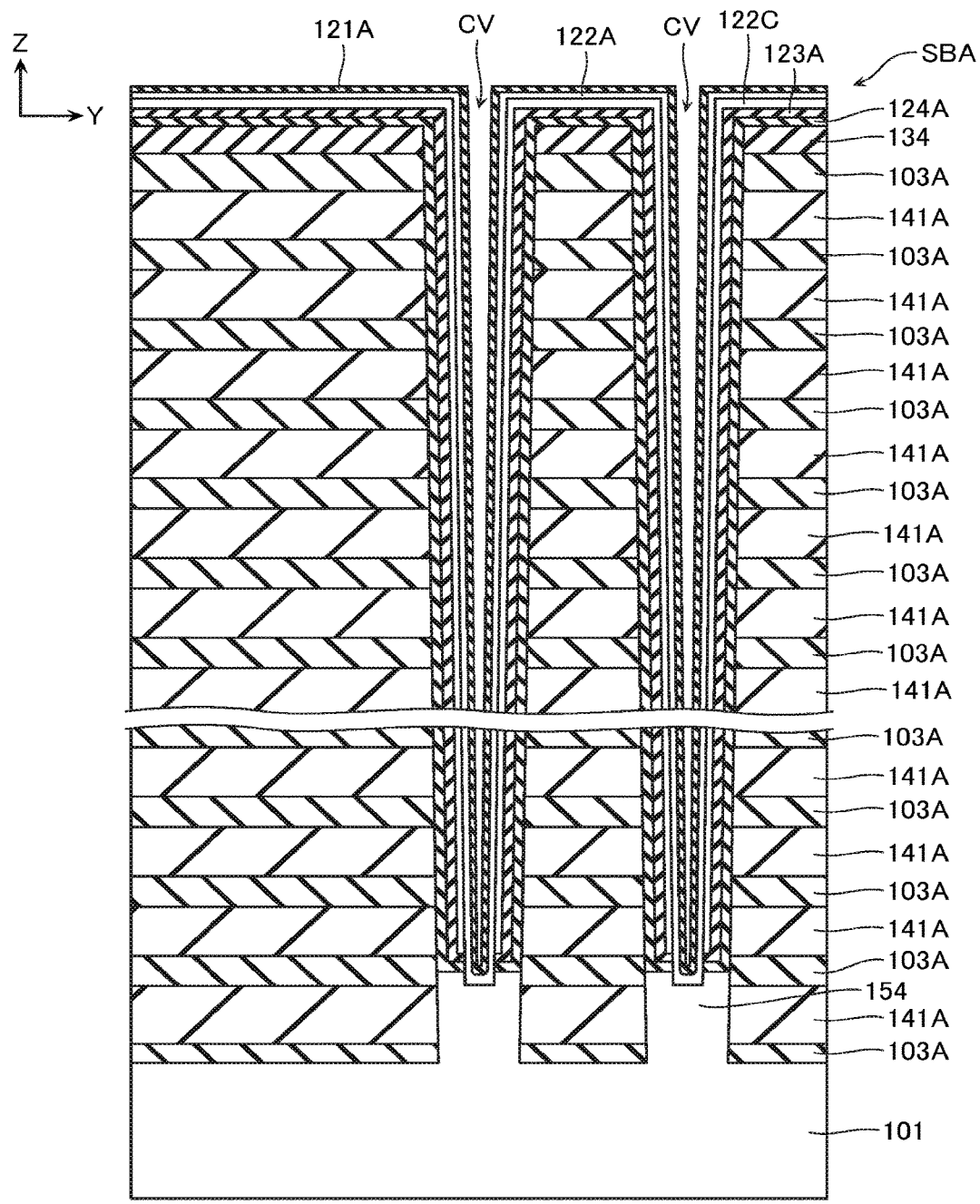

Next, as shown in FIG. 22, a heat process is applied to this semiconductor layer 122A to oxidize the surface of the semiconductor layer 122A to form an oxide film layer 121A. This oxide film layer 121A is a film that will become the above-mentioned oxide film layer 121. Thereafter, by performing the same processes as the first embodiment, the structure shown in FIG. 18 may be obtained.

[Third Embodiment]

Figure 23:
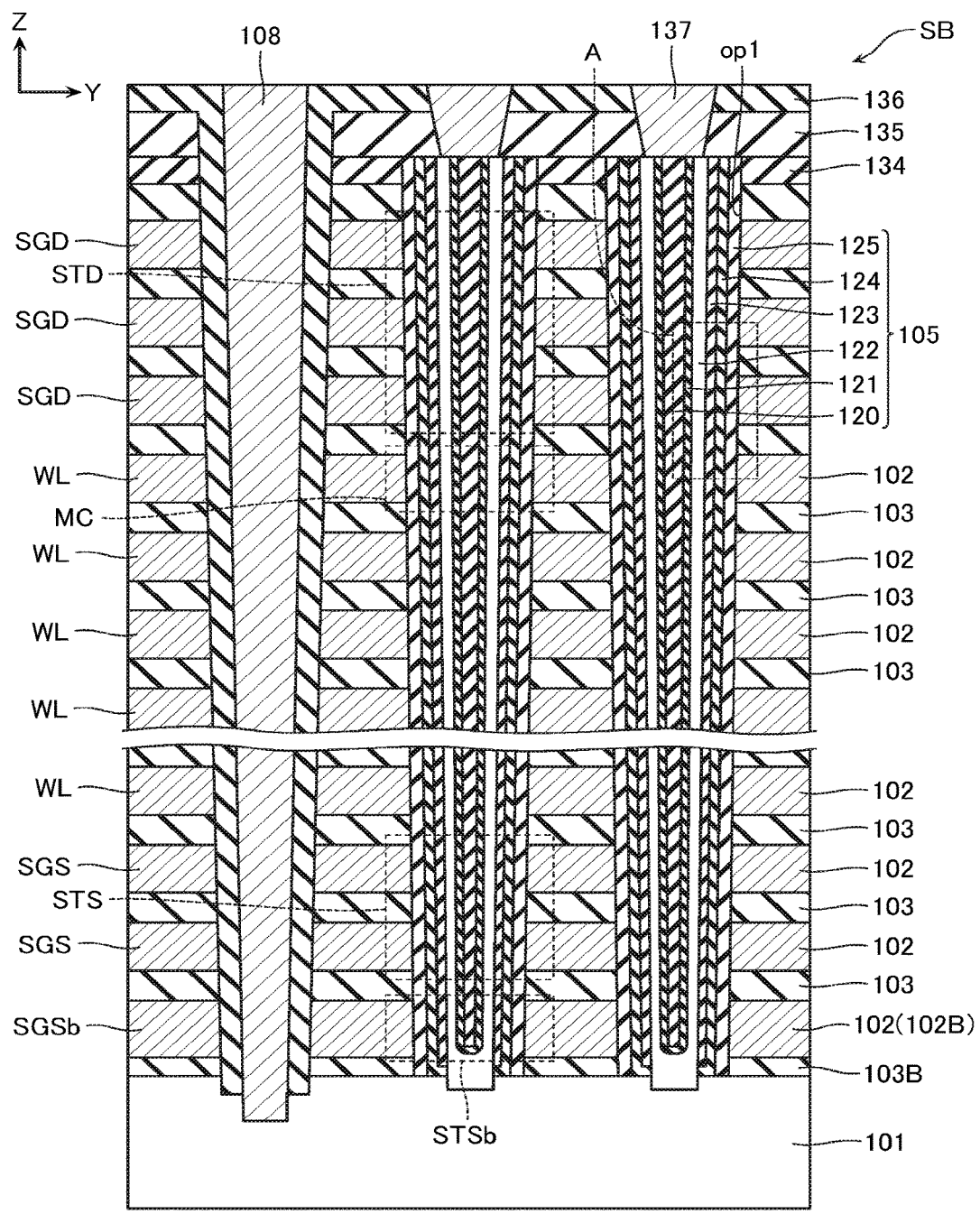
FIG. 23 is a sectional view showing a structure of apart of the nonvolatile semiconductor memory device according to a third embodiment.

Referring now to FIG. 23, the structure of the nonvolatile semiconductor memory device according to the third embodiment will be described. The entire structure of this third embodiment is similar to that of the first embodiment (FIG. 1 to FIG. 4).

However, this third embodiment is different from the first embodiment in that the block insulating layer 125 is formed only on the sidewall of the opening op1, and is not formed on the upper surface and the lower surface of the conductive layer 102. In other words, the block insulating layer 125 forms a part of the memory shaft 105, and is formed only in the periphery of the semiconductor layer 122.

Also in this third embodiment, a similar advantage to that of the first embodiment may be obtained by forming a semiconductor layer 121 between the semiconductor layer 122 and the core insulating layer 120 by thermally oxidizing the semiconductor layer 122.

[Others]

While certain embodiments have been described, these embodiments have been presented by way of example only, and are not intended to limit the scope of the inventions. Indeed, the novel methods and systems described herein may be embodied in a variety of other forms. Furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor emory device, comprising:
  a substrate;
  a first semiconductor layer;
  a stacked body in which a plurality of conductive layers and a plurality of interlayer insulating layers are alternately stacked along a first direction above the first semiconductor layer;
  a second semiconductor layer having a longitudinal direction along the first direction, and provided above the first semiconductor layer;

a memory insulating layer including a charge accumulation layer provided between the second semiconductor layer and the plurality of the conductive layers;

a core insulating layer having a longitudinal direction along the first direction, and provided in the second semiconductor layer;

an oxide film layer provided between the core insulating layer and the second semiconductor layer; and a third semiconductor layer being formed integrally with the substrate, extending in the first direction, and being connected to the second semiconductor layer.

2. The semiconductor memory device according to claim 1, wherein
the oxide film layer is an oxide of a semiconductor included in the second semiconductor layer.

3. The semiconductor memory device according to claim 1, wherein
the oxide film layer and the core insulating layer are silicon oxide films, and
a density of the silicon oxide film in the oxide film layer is larger than a density of the silicon oxide film in the core insulating layer.

4. The semiconductor memory device according to claim 1, wherein
a curvature of a lower end of the oxide film layer is smaller than a curvature of a lower end of the second semiconductor layer.

5. The semiconductor memory device according to claim 4, wherein
the oxide film layer is an oxide of a semiconductor included in the second semiconductor layer.

6. The semiconductor memory device according to claim 1, wherein
the oxide film layer is an oxide of a semiconductor included in the second semiconductor layer.

7. A semiconductor memory device, comprising:
a first semiconductor layer;
a stacked body including a plurality of conductive layers and a plurality of interlayer insulating layers stacked along a first direction on the first semiconductor layer;
a second semiconductor layer having a longitudinal direction along the first direction;
a memory insulating layer that is provided between the second semiconductor layer and the plurality of the conductive layers and includes a charge accumulation layer; and
an oxide film layer arranged to be in contact with the second semiconductor layer on an opposite side of the memory insulating layer,
a curvature of a lower end of the oxide film layer being smaller than a curvature of a lower end of the second semiconductor layer.

8. A method of manufacturing a semiconductor memory device, comprising:
laminating alternately a plurality of interlayer insulating layers and first layers above a substrate to form a stacked body;
forming a through hole penetrating through the stacked body;
forming a crystal growth layer above the substrate in a bottom of the through hole; forming a memory insulating layer including a charge accumulation layer along an inner wall of the through hole;

forming a semiconductor layer along an inner wall of the through hole, the semiconductor layer having a longitudinal direction along a direction intersecting the substrate, and opposing to the plurality of interlayer insulating layers and first layers via the memory insulating layer; and oxidizing an inner wall of the semiconductor layer to form an oxide film layer.

9. The method of manufacturing a semiconductor memory device according to claim 8, further comprising embedding a core insulating layer on an inner wall of the oxide film layer.

10. The method of manufacturing a semiconductor memory device according to claim 8, wherein the semiconductor layer is formed using amorphous silicon as its material.

11. The method of manufacturing a seam conductor memory device according to claim 8, wherein the core insulating layer is formed using chemical vapor deposition.

12. The method of manufacturing a semiconductor memory device according to claim 8, wherein after forming the memory insulating layer, a cover film is formed along the memory insulating layer, and
the semiconductor layer is formed along an inner wall of the through hole via the cover film.

13. The method of manufacturing a semiconductor memory device according to claim 12, the cover film is formed using amorphous silicon as its material.

14. A semiconductor memory device, comprising:
a first semiconductor layer;
a stacked body in which a plurality of conductive layers and a plurality of interlayer insulating layers are alternately stacked along a first direction above the first semiconductor layer;
a second semiconductor layer having a longitudinal direction along the first direction, and provided above the first semiconductor layer;
a memory insulating layer including a charge accumulation layer provided between the second semiconductor layer and the plurality of the conductive layers;
a core insulating layer having a longitudinal direction along the first direction, and provided in the second semiconductor layer; and
an oxide film layer provided between the core insulating layer and the second semiconductor layer, a curvature of a lower end of the oxide film layer being smaller than a curvature of a lower end of the second semiconductor layer.

15. The semiconductor memory device according to claim 14, wherein
the oxide film layer is an oxide of a semiconductor included in the second semiconductor layer.

16. The semiconductor memory device according to claim 14, wherein
the oxide film layer and the core insulating layer are silicon oxide films, and
a density of the silicon oxide film in the oxide film layer is larger than a density of the silicon oxide film in the core insulating layer.

17. The semiconductor memory device according to claim 14, wherein
the oxide film layer is an oxide of a semiconductor included in the second semiconductor layer.

* * * * *